United States Patent [19]

Coleby et al.

[11] Patent Number: 4,635,208
[45] Date of Patent: Jan. 6, 1987

[54] COMPUTER-AIDED DESIGN OF SYSTEMS

[75] Inventors: Stanley E. Coleby; Michael H. Forster, both of Salt Lake County, Utah

[73] Assignee: Hewlett-Packard Company, Palo Alto, Calif.

[21] Appl. No.: 692,725

[22] Filed: Jan. 18, 1985

[51] Int. Cl.⁴ .............................................. G06F 15/70
[52] U.S. Cl. ................................................. 364/491
[58] Field of Search ............... 364/480, 488, 489, 490, 364/491

[56] References Cited

U.S. PATENT DOCUMENTS 3,622,762 11/1971 Dyer ................................. 364/489
4,377,849 3/1983 Finger et al. ...................... 364/491

Primary Examiner—Michael L. Gellner
Attorney, Agent, or Firm—Woodcock Washburn Kurtz Mackiewicz & Norris

[57] ABSTRACT

A system is designed by a computer performed method using object oriented programming in which the manipulative programs are linked to the data records which represent the various elements in the system. The data records are linked by pointers in a hierarchy so that operations proceed from link to link without the need for interpreting character string commands. Only the highest level commands must be interpreted in a time consuming manner. Thereafter, the program proceeds quickly from linked data record to linked data record.

12 Claims, 10 Drawing Figures

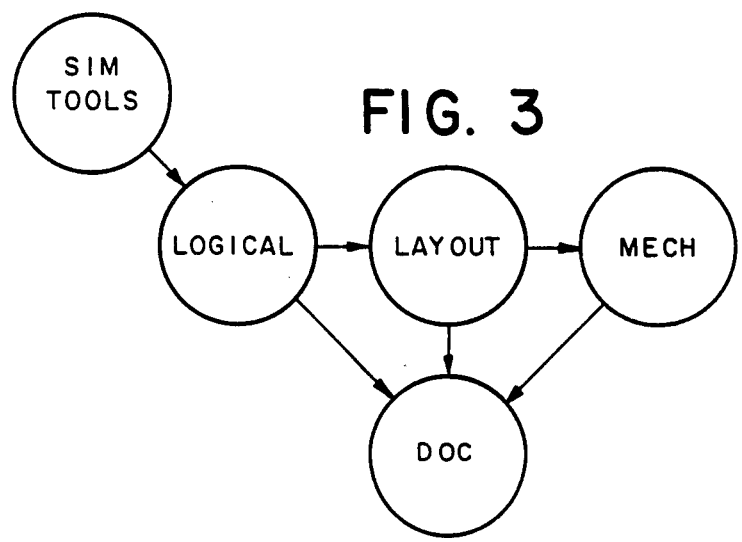
FIG. 3
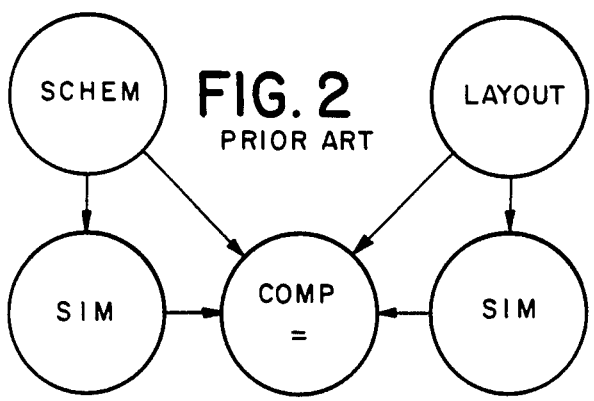
FIG. 2
PRIOR ART
FIG. 4
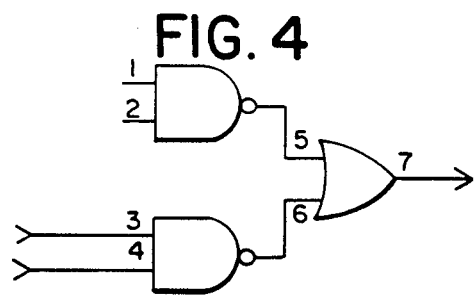
FIG. 5
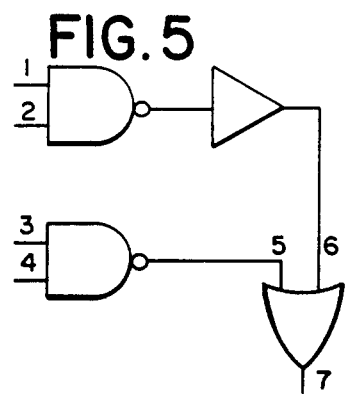

DATA-OBJECT SYSTEM

COMPUTER-AIDED DESIGN OF SYSTEMS

BACKGROUND OF THE INVENTION

This invention relates to computer aided design and more particularly, to controlling the entire design, for example, from engineering concepts through physical design and tests, to schematics, final layout and manufacturing specifications.

Considerable emphasis has been placed on computerized design. Computer-aided design has been used, for example, to lay out integrated circuits and VLSI chips. Computer-aided techniques have also been used to translate logic diagrams into electrical schematics and to lay out printed circuit boards from electrical schematics. Examples of such computer-aided electronic circuit design are shown in U.S. Pat. Nos. 4,377,849-Finger, et al "MACRO ASSEMBLER PROCESS FOR AUTOMATED CIRCUIT DESIGN"; and 3,622,762-Dyer, et al "CIRCUIT DESIGN BY AN AUTOMATED DATA PROCESSING MACHINE".

Typically, in the prior art, computer-aided techniques have been used to generate electrical schematic diagrams and another computer-aided process has been used to simulate the operation of the circuit and another, to generate physical layouts of the circuit board. Then, a simulation is made of the operation of the electrical and mechanical circuits and the two are compared. Differences are adjusted, finally producing an electrical and mechanical layout of the circuit which satisfies the designer's requirements. Documentation representing the electrical schematic and the physical layout is produced and used in the manufacture of the circuit boards. One of the principal problems in this prior art approach is that when changes are made in either the physical layout of the circuit or in the electrical schematic, these changes are not necessarily accurately reflected in the documentation for all parts of the electronic circuits.

It is desirable to bind the logical model, electrical circuit layout and mechanical design in the computer program so that changes in any one of them are reflected in changes in all of them and in their documentation. This has not been done in the past because of the complexity of programming required to perform all of the operations on one single data base.

Workers in the field have recognized that object-oriented programming will reduce the complexity of coding. For example, Xerox Corporation developed a computer-aided system referred to as "Small Talk". But the speed of the system was not sufficiently high for the design automation process. It was not a computational efficient program.

It is an object of the present invention to provide a computer-aided design system with object-oriented coding which is extremely fast.

It is another object of the present invention to increase the productivity of designers by providing a tool which will produce complete designs.

It is another object of the present invention to reduce errors and produce design continuity.

SUMMARY OF THE INVENTION

In accordance with the present invention, a graphical computer-performed method of designing a system includes data objects programming in which a plurality of manipulative programs are linked to each data record representing a primitive element in the system. The manipulative programs perform all of the operations necessary for the design process. The data records are linked in a hierarchy which graphically represents the design. A series of high order, very simple, commands operate selected manipulative programs in the hierarchy. Because the high order commands are very simple, and because the manipulative programs are linked to the data records in the hierarchy, it is not necessary to change each of the high order commands when a change is made in the data base representing the design. Changes in the design can be made easily and quickly without extensive changes in the programming.

Change and revision control are much easier. The manipulative programs linked to a particular data record contain the only coding which directly manipulate that data record. The ability to configure the data base during run-time is easier. Another advantage of the invention is complexity management. It allows integration of cross-links which permit the use of a logical model, which controls the complete design. In the case of electronic design, an electrical circuit layout is generated by the computer and a mechanical design is generated, both directly from the logical model. Documentation is produced from the logical model, the circuit layout and the mechanical layout. The logical mode, electrical circuit layout and mechanical design are bound in the computer so that changes in any one of them will be reflected in changes in all of them and in their documentation.

In one application, the logical model produced by the computer-aided process of the present invention represents devices such as AND gates and resistors, and their connections. It does not represent unit designations or pin numbers. From the logical model, an electrical circuit layout is generated which has unit designations and pin numbers. The electrical circuit layout defines trace widths and attributes such as the capacitance of traces. From this, a mechanical design is produced which models the packaging, card cages, structures and assemblies. Each of the logical models, circuit layout, and physical design, may be viewed, manipulated, and operated upon. The logical model is used to control the basic circuit designs, the layout controls, VLSI and printed circuit board design. The mechanical design controls the packaging and assembly of the product.

The foregoing and other objects, features and advantages of the invention will be better understood from the following more detailed description and appended claims.

SHORT DESCRIPTION OF THE DRAWINGS

FIG. 2 depicts the manner in which the prior art operates;

FIG. 3 depicts the advantages of the present invention;

FIG. 4 depicts a simple logical circuit, and FIG. 5 depicts a revision of it;

DESCRIPTION OF THE PREFERRED EMBODIMENT

Figure 1:
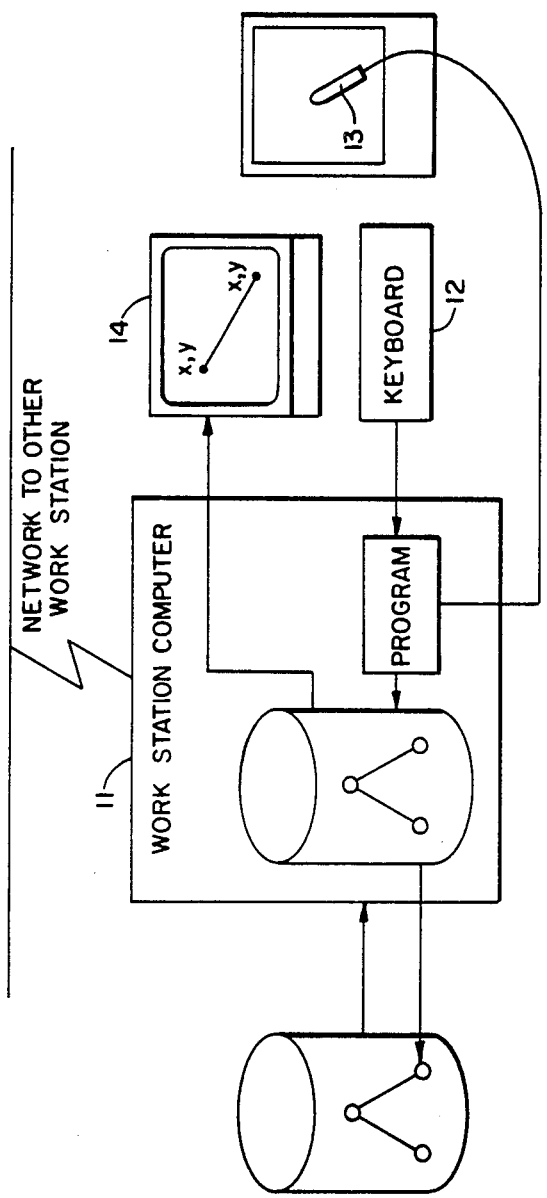
FIG. 1 depicts a computer graphics system used in a computer-aided design and/or engineering system.

FIG. 1 depicts a computer graphics system for computer aided design wherein a work station computer 11 responds to inputs from a keyboard 12 and a digitizing device such as a light pen, tablet, or mouse 13, displays designs on the graphical display device 14. Programs and a data base are stored in the mass storage 15 which is typically magnetic disk storage. In a computer graphics aided design, shapes or lines are displayed on the graphical display device 14. As a simple example, the line connecting the points x,y and $x_1,y_1$ is shown. Typically, a data base object is brought from mass storage to computer 11 as a whole. Multiple programs are added to the base structure. A message like "DISPLAY" sent to the structure results in a graphic presentation on the display 14. Inputs from the keyboard 12 and digitizing device 13 are sent by messages back to the data base structure resulting in changes in data base. The whole data structure is cleaned up and stored back in mass storage 15.

FIG. 2 depicts a typical prior art technique for designing an electrical circuit with computer graphic techniques. An electrical schematic is generated and from this a net list is extracted. From the net list, a mechanical layout is generated. Simulations of the operating characteristics of the electrical schematic are performed to verify the schematic. Likewise, simulation is performed on the mechanical layout. The simulations are compared to verify them and adjustments are made.

Summarizing, the following steps are performed:
(1) The schematic is drawn as a disjointed line;
(2) Net list is extracted and sent to simulation;
(3) Simulation verifies design;
(4) Net list is sent to layout;
(5) Manual and/or automatic layout occurs;
(6) Net list is extracted from layout;
(7) Simulation on layout is performed;
(8) Net lists from schematic and layout are compared;
(9) Simulations are manually compared.

In accordance with the present invention, designs such as an electrical circuit are produced as depicted in FIG. 3, wherein all of the programs for generating the logical model, the electrical and mechanical layouts are generated from the same data base. The operation of all of the circuits is simulated on the same data base and documentation is produced from the same data base.

The operation in accordance with the present invention is summarized as follows:
(1) The logical layout and mechanical models are stored in the same data base with cross-linkage.
(2) The designer generates the logical model;
(3) Simulation verifies the logical model. No extraction is necessary. The simulation works directly from the logical model.
(4) The logical model directs the layout and does not allow wrong connections.
(5) The layout directs the mechanical model.
(6) Information like unit reference assignment is only stored in one place, the layout.
(7) Documentation is generated by taking points of view of the logical model and referencing information in the layout model to form a schematic.

As an example of the problems encountered in prior art computer-aided design of electrical circuits, consider FIGS. 4 and 5. Two AND circuits A and B are connected to an OR circuit. This is designed graphically by selecting the primitive shapes of the AND gates and displaying them. The data base representing the components is designated A. Then wires are added by a data base designated B, and connections are added by a data base designated C. After graphical entry of the electrical circuit, a net list is extracted. (This is a list of all pins on each component and the connections pin to pin.) The net list is typically an input to a simulation program which generates the output waveforms. Problems are discovered which have to be corrected in the graphical schematics. The circuit designer continues this procedure until an entire circuit is designed. A major problem arises when he wants to make changes in the circuit such as depicted in FIG. 5, wherein an inverter is added and the OR gate C is rotated by 90°. The designer must graphically change the schematic, re-extract the entire net list, and re-do the simulation.

Figure 6:
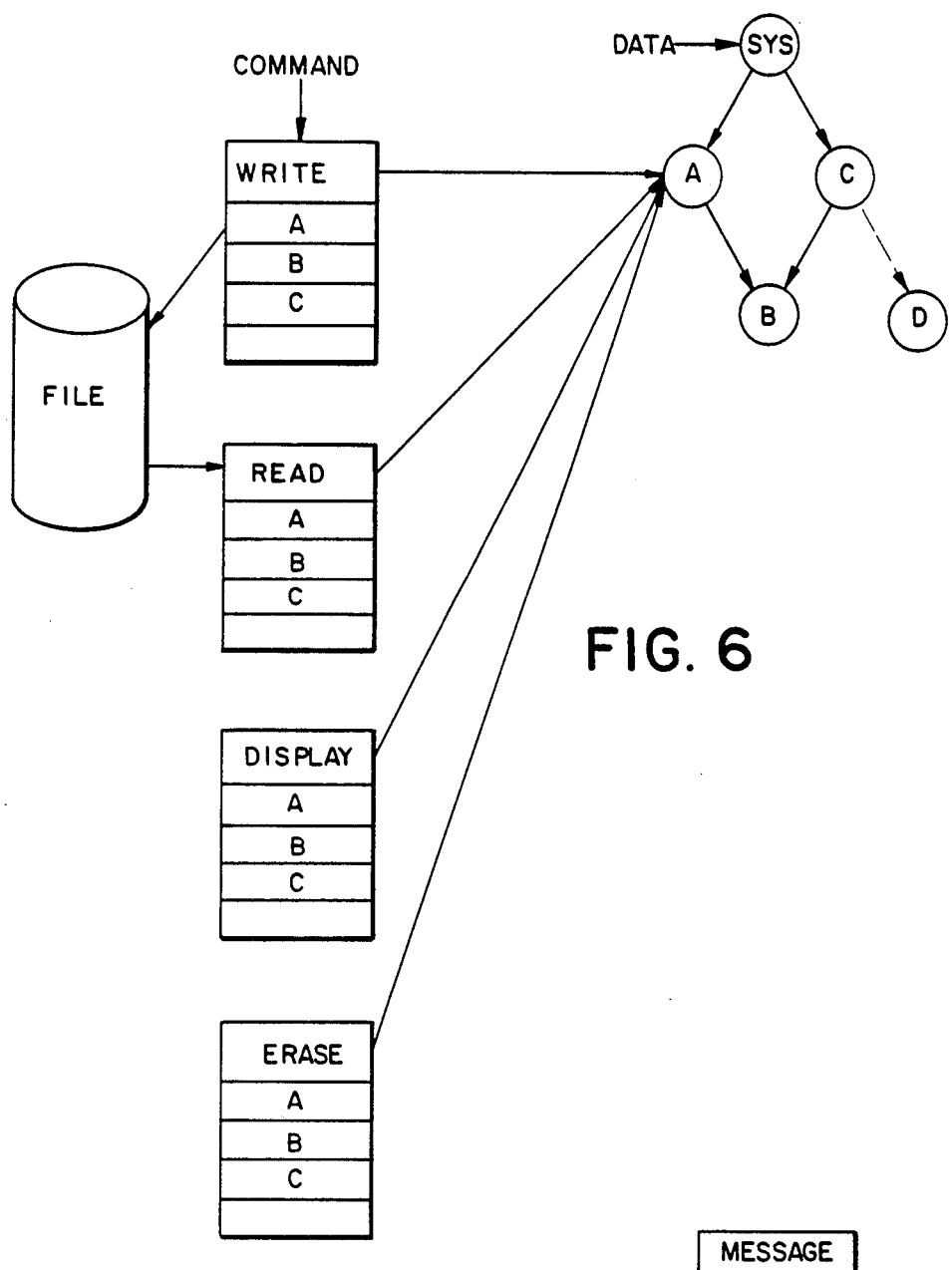
FIG. 6 depicts the manner in which most prior art systems retrieve graphics from a data base.

FIG. 6 depicts a prior art computer graphics program which includes commands such as WRITE, READ, DISPLAY, ERASE, and other commands. A data base includes a plurality of records indicated by the circles. For example, the records depicted by the circle A denote the components such as the AND and OR gates in FIG. 4. The records depicted by the circles B and C denote the wires and the connections, respectively. The commands which write and read these data records, display them, erase them, and do other operations, each include code which manipulates a particular data record. That is, each of the commands has a section which deals specifically with the data records A, B, and C. When the programmer wants to make a change to the data base like adding a new class of elements, D, which represents miscellaneous lines, he must change every one of the commands and programs which operate on this new record. When the programmer changes another existing element, like element A, he must go back into the command programs and change every one of them. This is an extensive change. Furthermore, the complexity of managing multiple programs on the same data base is quite high. For example, doing a simulation, or a mechanical layout, using the same data base is so complex that it is generally not done.

Figure 7:
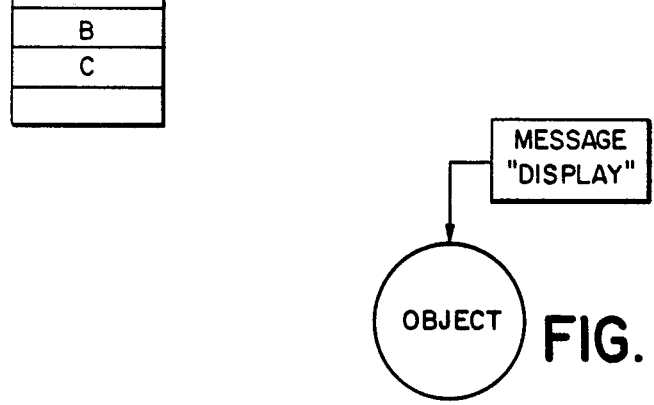
FIG. 7 depicts a prior art object oriented programming technique.

Object-oriented programs tend to alleviate the problem. Referring to FIG. 7, object-oriented programs are accessed by commands which are in a character string such as "DISPLAY." For example, consider the manner in which the command "DISPLAY", draws a line between x,y, and $x_1,y_1$. The character string DISPLAY is parsed. That is, the characters in the string are compared one by one by the object. When the parsing indicates that a DISPLAY command is to be performed, it displays the line segment x,y–$x_1,y_1$. This is quite time consuming. It is so time consuming that prior art computer graphics systems using object-oriented programming have not been able to provide good interaction.

Figure 8:
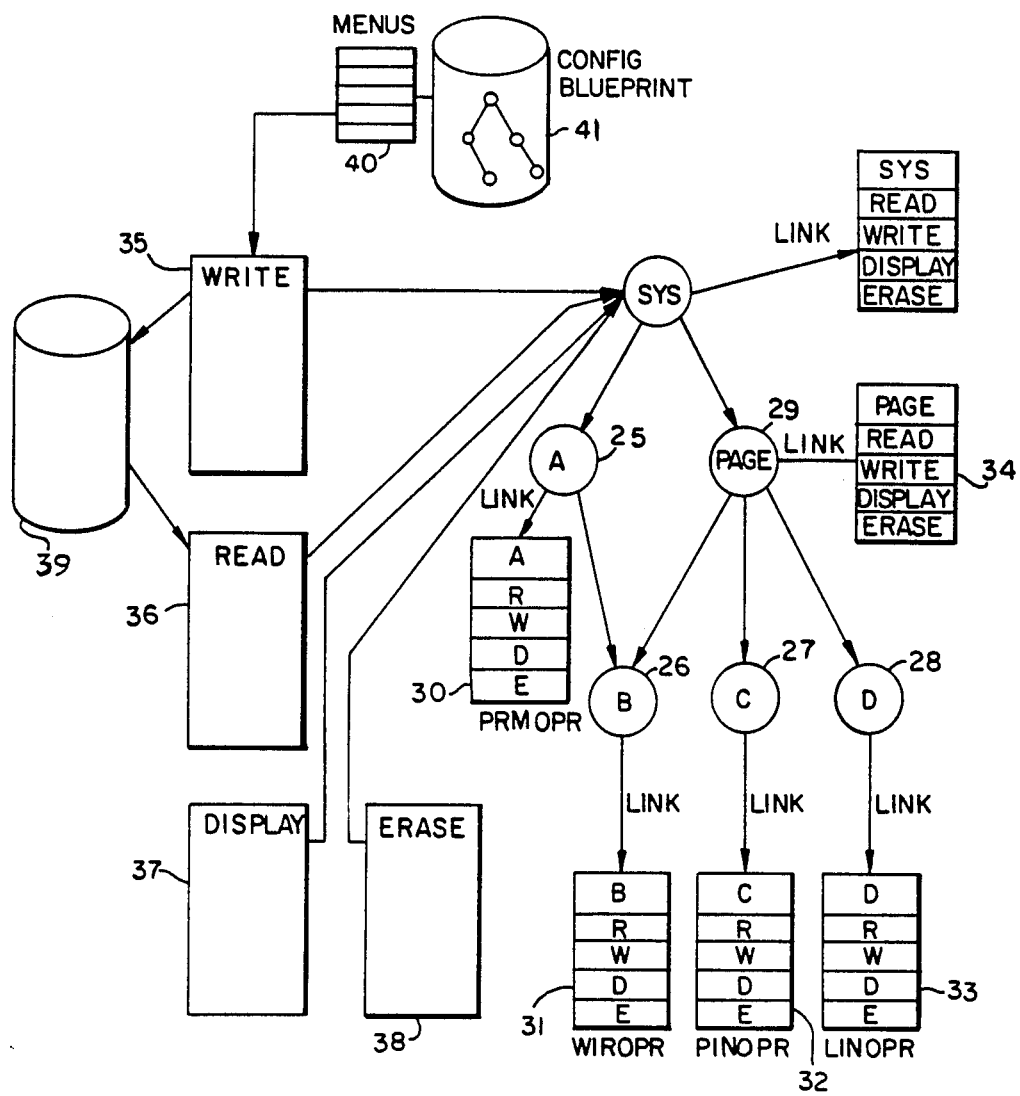
FIG. 8 depicts the object-oriented computer graphics system of the present invention.
Figure 8A:
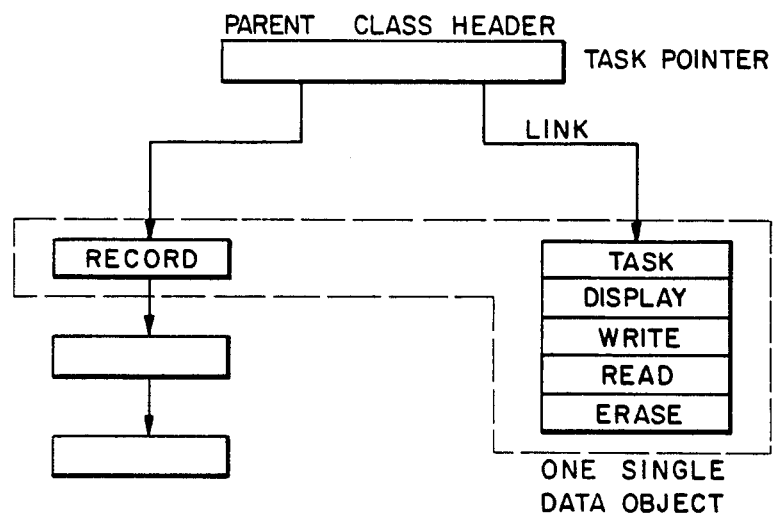
FIG. 8A depicts a data object in accordance with the invention.
Figure 8B:
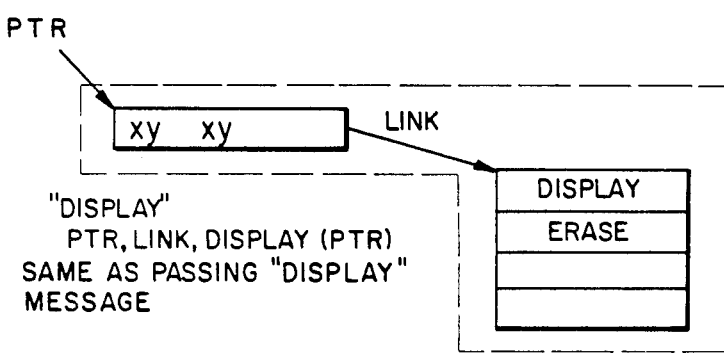
FIG. 8B depicts the manner in which a data object performs a display.

The present invention as depicted in FIGS. 8, 8A and 8B, allows the use of object-oriented programming which quickly performs graphical operations in access times which produce good interaction. The invention uses a modification of the object-oriented technique, which will be referred to as "data-object". A data-object is a data record that has a link to its manipulative programs. The manipulative programs are the only programs which directly manipulate the data records.

A message is sent to the data-object via a procedure call through the link stored in the record. This allows the interpretation of a message to be as fast as a procedure call.

Referring to FIG. 8A, in order to reduce storage and increase speed, the data-object 20 does not contain its link directly, but its parent data-object 21 stores it. This allows the pointer to be fetched once and used with each data record, since all common data records are stored in a list under their common data-object parent. But each data record and its manipulative programs, indicated at 22, still function as a data-object.

FIG. 8B depicts the manner in which a data object performs the task of displaying the line $x,y-x_1,y_1$. The direct link from the parent data-object 23 to the manipulative program 24 performs the display procedure just as parsing the "DISPLAY" message carried out this procedure in the prior art.

FIG. 8 shows the data objects of the present invention configured in a data object system. Stored data records 25-29 each represent a primitive element in the system. Manipulative programs 30-34 are respectively linked to the data records 25-29. Each set of manipulative programs performs the necessary operation on the primitive elements for the design of the system.

For example, the set of programs 30 denoted PRMOPR perform operations on the primitive shapes of circuits in the electronics circuit, such as the AND and OR gates of FIG. 4. These programs include the capability to read, write, display, erase, move, rotate, highlight, and perform other operations on the primitive elements which in this case are components. In the exemplary embodiment, there are twenty-five manipulative programs linked to each record in the data base.

The set of manipulative programs 32 is denoted PINOPR. PINOPR includes twenty-five manipulative programs for performing all operations on the data records representing the pins. The programs 31 are denoted WIROPR. This includes twenty-five manipulative programs for performing all operations on the data records designating the wire connectors. Each small program represents a single message.

Note that a data-object might be a record which has a structure of other data-objects underneath it. Such a data-object includes a data record 25 and manipulative program 30 in FIG. 8. It is the responsibility of this data-object to pass on the messages it received to the lower data-object structure.

In accordance with the present invention, the data records in the data base are linked so that the manipulative programs are performed in a sequence set up by the designer and without the need for parsing, or interpreting the character string of a command. The low level data records 26-29 are linked in a hierarchy and these in turn are linked to the medium level record 29. The medium level manipulative programs 34 perform operations on an entire page of schematics, for example. The designer has the capability to extend the hierarchical tree of linked data records so that an entire system is represented.

Access to the tree of data records is through high order commands such as those indicated at 35-38. These are retrieved from file 39 and perform operations, such as DISPLAY or WRITE, on the entire design which the designer has laid out. Note that only these high level programs must be parsed to interpret the character string to determine what operation is to be performed. Once the character string has been parsed and the operation to be performed has been determined, access is provided to the highest level program in the data base. Then, the program proceeds by links from one pointer to another of the records in the data base. Only the high level commands, such as 35-38, require time for the interpretation of character strings. After this initial interpretation, a program, such as DISPLAY, proceeds quickly by means of the linked pointers.

A menu/configuration file 40, 41 sets up a menu for a particular application. This file also contains a blueprint of the data-object structure required for this application. High-level programs refer to this blue-print to set up the initial data base structure. The menus, when selected, send high level messsages to the high-level procedures.

Changes can easily be made in the system by just changing the configuration file. Once the high level programs, configuration file and data records are set up with links to their associated manipulative programs, most of this programming will not be changed when a change is made in the system. The high and medium level programs have nothing which is unique to a particular data record. Data records can be changed without changing the high and medium level programs. These programs perform an operation dependent only on the links between pointers.

FIG. 8 contrasts the invention with the problem encountered in the prior art as shown in FIG. 6. When a new class of data object, 28, designated "D", are added to the structure, the command programs 35-38 need not change, since they do not directly manipulate the data base structure. This new data-object, once added to the structure, will receive all the messages from its parent data-object above. Now a "DISPLAY" message sent to the data structure will display "D", because D was added with its manipulative programs 33 attached. Also, note that changes to element "A" only affect manipulative programs attached to "A" and not to any of the systems command procedures.

The Appendices include exemplary listings showing the manner in which the invention was implemented using the language MAINSAIL, by XYDAC. As with all computer programs, they must be written for the particular hardware and carefully debugged. The Appendices are useful examples of one implementation.

Appendix I contains listings of exemplary low level programs. Simple display, erase, move and duplicate routines are given first. Appendix I also contains exemplary listings for PINOPR, CMPOPR, and WIROPR, which were referred to in conjunction with FIG. 8. These manipulative programs perform the basic operations on data records which represent pins in the case of PINOPR, basic components in the case of CMPOPR, and wires for program WIROPR.

Appendix II contains medium level programs. Note that these are much simpler than the low level programs. A particular program included in the Appendix is a procedure for displaying all of the logic elements in a group, for moving a group of records, and for copying a group of records.

Appendix III contains high level programs. The particular programs include a program for moving records, copying records and deleting records. Note the simplicity of the high level programs. This is an important advantage of the invention in that changes in the system require minimal changes in the high and medium level programs. Most of the changes can be made at one place in the low level programs.

Appendix IV is an example of a configuration file which links the data records in the design of a particular circuit.

While a particular embodiment of the invention has been shown and described, various modifications are within the true spirit and scope of the invention. The appended claims are, therefore, intended to cover all such modifications.

APPENDIX I

LOW LEVEL PROGRAMMING

```
###########################################################################
#                                                                         #
#   This next section is the record operator of the prim record.          #
#   This first one display the record.                                    #
#                                                                         #
#####################################################################

PROCEDURE display(
      POINTER(dataObjectClass) primHdr;
      POINTER(boundaryClass) record;
      INTEGER status;
      );

BEGIN "display"

IF status <> gpComplement THEN status := 0;
    DrawPrim(primHdr,PrimPtr.index[record:primclass.primSelect],
        record:primclass.primRotation, record:primclass.linerule,
        record.left, record.bottom,status);

RETURN;
    END "display";

###########################################################################
#                                                                         #
#   This routine erases the record off the screen.                        #
#                                                                         #
#####################################################################

PROCEDURE erase(
      POINTER(dataObjectClass) primHdr;
      POINTER(boundaryClass) record;
      INTEGER status;
      );

BEGIN "erase"

DrawPrim(primHdr,PrimPtr.index[record:primclass.primSelect],
        record:primclass.primRotation, record:primclass.linerule,
        record.left, record.bottom, gpwhite);

RETURN;
    END "erase";

###########################################################################
#                                                                         #
#   This routine is for moving a record                                   #
#                                                                         #
#####################################################################

PROCEDURE move(
      POINTER(dataObjectClass) primHdr;
      POINTER(boundaryClass) record;
      INTEGER status;
      REAL deltaX, deltaY;
      );

BEGIN "move"

record.left  .+ deltaX;
      record.bottom .+ deltaY;
      record.right .+ deltaX;
      record.top   .+ deltaY;

RETURN;

END "move";
```

```
##############################################################################
#
#   This routine is for copying a record                                     #
#                                                                            #
##############################################################################

POINTER (boundaryClass) PROCEDURE duplicate(
  POINTER(dataObjectClass) primHdr;
  POINTER(boundaryClass) record;
  INTEGER status;
  );

BEGIN "duplicate"

POINTER(primClass) prim;

prim := new(primClass);

prim.linerule := record:primClass.linerule;
  prim.primSelect := record:primClass.primSelect;
  prim.primRotation := record:primClass.primRotation;

prim.left := record.left;
  prim.bottom := record.bottom;
  prim.right := record.right;
  prim.top := record.top;

RETURN(prim);

END "duplicate";

##############################################################################
#
#    This module handle primitive pins.  The initial procedure sets          #
#    up the pin's structures.  Later, these will be structure                #
#    blasted in from a pin library.                                          #
#                                                                            #
##############################################################################

BEGIN "pinopr"

RESTOREFROM "(application header)";
  SOURCEFILE "(data class)";

MODULE(labelOperatorClass) pinopr;

POINTER(pinIndexClass) pinPtr;

CLASS pinIndexClass(                    #Head of the pin list
    POINTER(pinVecClass) ARRAY(0 TO 100) index;
    );

CLASS pinVecClass(                      #individual vector list for each pin.
    String name;
    REAL ARRAY(1 TO *) vec;
    );

CLASS(temporaryClass) tempPinClass(     #temporary data for this model
    REAL    cuePositionX, cuePositionY;
    INTEGER cueRotation, cueSelect;
    INTEGER defaultLineRule, defaultSelect, defaultRotation;
    INTEGER currentlinerule;
    INTEGER fillshaderule;
    BOOLEAN cueCursor;
    );

DEFINE endpin = [-9999.],
         movpin = [-9998.],
         tripin = [-9997.],
         squpin = [-9996.],
         defpin(label,cnt) = [ptr := new(pinVecClass);
                              pinPtr.index[(pos .+1)] := vptr := ptr;
```

```
                                new(ptr.vec,1,cnt);
                                ptr.name := label;
                                init ptr.vec ],
        rotateprev(label) = [ptr := new(pinVecClass);
                             pinPtr.index[(pos .+1)] := ptr;
                             new(ptr.vec,1,vptr.vec.ub1);
                             ptr.name := label;
                             copyrotate(ptr,vptr);
                             vptr := ptr ],
        rotatethree =[ rotateprev("270");
                       rotateprev("180");
                       rotateprev("90") ];

###############################################################################

# PROCEDURE for getting a rotated copy of a pin definition

###############################################################################

PROCEDURE copyrotate(
      POINTER(pinVecClass) ptr,prevptr;
      );

BEGIN "copyrotate"

REAL xtemp;
      INTEGER index;

ptr.vec[1] := prevptr.vec[2];
      ptr.vec[2] := -prevptr.vec[3];
      ptr.vec[3] := prevptr.vec[4];
      ptr.vec[4] := -prevptr.vec[1];

index := 5;
      DOB "copy it"
        xtemp := prevptr.vec[index];
        IF xtemp > squpin THEN BEGIN "copy"
           ptr.vec[index+1] := -prevptr.vec[index];
           ptr.vec[index] := prevptr.vec[index+1];
           index .+2;
           CONTINUE "copy it";
           END "copy";
        ptr.vec[index] := xtemp;
        index .+1;
        IF xtemp = endpin THEN DONE "copy it"
      END "copy it";
      RETURN;
   END "copyrotate":

###############################################################################
                                                                              #
    This module handles an order of data objects as a component.              #
                                                                              #
###############################################################################

:GIN "cmpOpr"

RESTOREFROM "(application header)";
SOURCEFILE "(data class)";

MODULE(dataOperatorClass) cmpOpr;

DEFINE component = [cmp:dataObjectClass];

CLASS(temporaryClass) tempcomponentClass( #Temporary data for components
   INTEGER defaultRotation;
   BOOLEAN cueFlag;
   POINTER(methodAccessClass) menuMethod;     #Pointer to method access rec
   POINTER(designObjectClass) defaultObject; #default object pointer to a compone
   REAL left,bottom,right,top;          #boundary class of default component.
   );
```

```
INITIAL PROCEDURE setUp;
  BEGIN "setUp"
    ttywrite(" cmpOPR: V2.0 DEC 21, 1983 ",eol);
  RETURN;
  END "setUp";

!#####################################################################
                                                                      #
   This procedure displays all the records contained in a component   #
                                                                      #
 #####################################################################

PROCEDURE display(
POINTER(dataObjectClass) compHdr;      #Pointer to the comp header class
POINTER(boundaryClass) cmp;            #Pointer to the selected component
INTEGER Msg;
);

BEGIN "display"

POINTER(dataObjectClass) order;        #Pointer to the class under the component gpWorldBox(cmp.left,cmp.bottom,cmp.right,cmp.top,singleLineDash);

order := component.structure;          #Get a pointer to class under component

WHILE order DO
   BEGIN "loop through classes"       #Cycle through all classes component.task.display(cmp,order,allmsg);    #display all classes
      order := order.next;            #Get pointer to the next class END "loop through classes";

RETURN;
END "display";

#######################################################################
                                                                      #
   This routine erases the record off the screen.                     #
                                                                      #
 #####################################################################

PROCEDURE erase(
POINTER(dataObjectClass) compHdr;      #Pointer to the comp header class
POINTER(boundaryClass) cmp;            #Pointer to the selected component
INTEGER Msg;
);

BEGIN "erase"

POINTER(dataObjectClass) order;        #Pointer to the class under the component order := component.structure;          #Get pointer to the class under component WHILE order DO
   BEGIN "loop through orders"        #Cycle through all class records component.task.erase(cmp,order,allMsg);  #erase all selected data objects
      order := order.next;            #Get pointer to the next class record END "loop through orders";

RETURN;
END "erase";
```

```
###############################################################
                                                              #
   The following procedure is the component highlight.        #
                                                              #
###############################################################

PROCEDURE highLight(
   POINTER(dataObjectClass) compHdr;    #Pointer to the comp header record
   POINTER(boundaryClass) cmp;          #Pointer to the component record
   INTEGER msg;
   );

BEGIN "highLight"

POINTER(dataObjectClass) order;         #Pointer to the class under the component order := component.structure;           #Get pointer to the class under component WHILE order DO
   BEGIN "loop through orders"          #Cycle through all class records component.task.highLight(cmp,order,allMsg); #highlight all selected data objec
   order := order.next;                 #Get pointer to the next class record END "loop through orders";

RETURN;

END "highlight";

###############################################################
                                                              #
   The following procedure is the component unhighlight.      #
                                                              #
###############################################################

PROCEDURE unhighLight(
   POINTER(dataObjectClass) compHdr;    #Pointer to the comp header record
   POINTER(boundaryClass) cmp;          #Pointer to the component record
   INTEGER msg;
   );

BEGIN "unhighLight"

POINTER(dataObjectClass) order;         #Pointer to the class under the component order := component.structure;           #Get pointer to the class under component WHILE order DO
   BEGIN "loop through orders"          #Cycle through all class records component.task.unhighlight(cmp,order,allmsg); #highlight all selected data obj
   order := order.next;                 #get pointer to the next class record end "loop through orders";

RETURN;

END "unhighlight";

###############################################################
                                                              #
   This routine generates the temporary record for the component header class.
                                                              #
###############################################################

PROCEDURE initialize(
   POINTER(dataObjectClass) compHdr;    #Pointer to the comp header record
   );
```

```
BEGIN "initialize"

POINTER(dataObjectClass) cmp;

IF NOT compHdr.temp THEN BEGIN "set up"
   compHdr.temp := new(tempComponentClass);#Allocate component temporary area
   compHdr.temp:tempComponentClass.defaultRotation := gpRot0;
   compHdr.temp:tempComponentClass.defaultObject := NULLPOINTER;

cmp := compHdr.structure;
   WHILE cmp DO BEGIN "loop"
     getDataOperator(cmp);
     cmp := cmp.next;
     END "loop";

END "set up";

RETURN;

END "initialize";

##############################################################################
#
#   The following procedure activates a given record.                        #
#                                                                            #
##############################################################################

PROCEDURE activate(
   POINTER(dataObjectClass) compHdr;      #Pointer to the comp header record
   POINTER(boundaryClass) cmp;            #Pointer to the component record
   INTEGER msg;
   );

BEGIN "activate"

POINTER(methodAccessClass) newMenuItem,    #Pointer to new menu item
                              next,       #Next method (sibling) to method item
                              sub,        #Beginning of submenu for method
                              parent;     #Parent of method
   POINTER(methodClass) modPtr;              #Pointer to the module for method
   POINTER(tempComponentClass) temp;         #Pointer to temporary form area
   BITS menuType;                            #Type of menu, here equal to zero
   STRING menuLabel,                         #Label method in the list
          moduleName,                        #Name of the method procedure
          menuText,                          #Text inside the menu
          selector,                          #Selector into methods
          softLink;                          #Soft link to forms library
   INTEGER top, right, l, b, r, t;           #Menu boundaries temp := compHdr.temp;                     #Get pointer to temporary form area
   IF NOT temp.menuMethod THEN RETURN;

softLink := popStringMessage(libTransferHook);#Get link to symbol library
   IF NOT softLink THEN RETURN;              #If there are no forms, return relativesOfMethod(temp.menuMethod,sub,next,modPtr,menuLabel,parent);
                                             #Find relatives of menu item
   menuType := '0;                           #This field is presently not used
   moduleName := "CMPOPR";                   #Name of the proc. which uses this
   l := b := 1;                              #Save left and bottom boundaries
   t := 23;                                  #Save top boundary WHILE softLink DO
     BEGIN "process form types"              #Process all form types
     getMenuExtent(parent,top,right);        #Get size of the menu method
     IF NOT top AND NOT right THEN
        BEGIN "defaults"                     #If no extent is given then,
        top := 0;                            # mark starting top and right
        right := 129;                        # default values
        END "defaults";
     r := right;                             #Get right boundary
```

```
    menuText := getNameOfObject(softLink);      #Text to be in the menu
    selector := softLink;                       #Save selector into methods
    newMenuItem := newMenuRecord(menuType,moduleName,menuLabel,menuText,
        l,r,t,b,selector);                      #Generate new menu record
    relocateMenuItem(newMenuItem,0,top+2,l,b,r,t);
                                                #Relocate menu item
    addMenuItemToTop(parent,newMenuItem);#Add new menu to top of list
    softLink := popStringMessage(libTransferHook);
                                                #Get link to forms library
    END "process form types";
generateMenuGraphics(parent);                   #Generate and fill in new menu items
RETURN;

END "activate";

:###############################################################
                                                                #
   The following procedure finds a record with the same header information.  #
                                                                #
:###############################################################

BOOLEAN PROCEDURE find(
MODIFIES POINTER(dataObjectClass) componentHdr; #Pointer to component header
PRODUCES POINTER(dataObjectClass) orderHdr;     #Pointer to order record
USES INTEGER Msg;                               #Indicates the type of record
);

BEGIN "find"

RETURN(FALSE);                                  #Return as not successful in find END "find";

#########################################################
                                                                #
   The following procedure deactivates a given record.          #
                                                                #
:###############################################################

PROCEDURE deactivate(
POINTER(dataObjectClass) compHdr;               #Pointer to the comp header record
POINTER(boundaryClass) cmp;                     #Pointer to the component record
INTEGER msg;
);

BEGIN "deactivate"

RETURN;

END "deactivate";

:###############################################################
                                                                #
   This routine cleans up the temporary record for the selected component.  #
                                                                #
:###############################################################

PROCEDURE cleanUp(
POINTER(dataObjectClass) compHdr;               #Pointer to the comp header record
INTEGER msg;
);
BEGIN "cleanUp"

POINTER(dataObjectClass) cmp;                   #Pointer to the class under component dispose(compHdr.temp);                          #Remove pointer to component temp. area
compHdr.temp := NULLPOINTER;                    #Remove pointer to component temp. area
```

```
cmp := compHdr.structure;                        #Get pointer to the component under comp
WHILE cmp DO                                     
  BEGIN "loop through components"                #Process all components of records cmp.task.cleanUp(cmp,allmsg);                #Cleanup at component level
    cmp.task := NULLPOINTER;
    cmp := cmp.next;                             #Get next component record END "loop through components";

RETURN;

END "cleanUp";

###############################################################################
#
#   This routine is used for dragging a data object around for cue.           #
#                                                                             #
###############################################################################

PROCEDURE drag(
POINTER(dataObjectClass) compHdr;                #Pointer to the comp header record
REAL X1,Y1;                                      #Given point for move
MODIFIES REAL X2,Y2,X3,Y3;                       #Drag handle input points
MODIFIES INTEGER Msg;                            #The record Msg indicator
OPTIONAL POINTER(boundaryClass) cmp;             #Pointer to the record
);

BEGIN "drag"

POINTER(objectClass) saveObject;
POINTER(tempComponentClass) temp;
POINTER(matrixClass) mat,oldmat;
POINTER(dataObjectClass) ptr,group;
POINTER(dataObjectClass) prmopr,pinopr,linopr;
POINTER(boundaryClass) prmstr,pinstr,linstr,record;
REAL deltaX,deltaY,newR13,newR23;
REAL centerX,centerY;
BITS buttons;
INTEGER keyBoard;

temp := compHdr.temp;

IF NOT cmp AND NOT temp.defaultObject THEN $raise(DASactivateController);

saveObject := Object;

IF NOT cmp THEN BEGIN "get sky"

accessDataObject(group,cmp,temp.defaultObject,orderMsg);
    centerX := (temp.left + temp.right)/2.;
    centerY := (temp.bottom + temp.top)/2.;
    gpConvertToGrid(centerX,centerY,FALSE);

deltaX :=  - centerX;
    deltaY :=  - centerY;
    END "get sky"
ELSE BEGIN "record drag"
    deltaX := -X1;
    deltaY := -Y1;
    END "record drag";

oldMat := gpWindowTop.stack;
gpPushMatrix;
mat := gpWindowTop.stack;

newR13 := X1 + deltaX;
newR23 := Y1 + deltaY;
mat.r13 := oldMat.r11*newR13 + oldMat.r12*newR23 + oldMat.r13;
mat.r23 := oldMat.r21*newR13 + oldMat.r22*newR23 + oldMat.r23;
```

```
prmopr := pinopr := linopr := NULLPOINTER;
prmstr := pinstr := linstr := NULLPOINTER;

IF NOT cmp:dataObjectClass.task THEN getDataOperator(cmp);

prmopr.task.display(prmopr,record,gpComplement);
     record := record.next; END "primitives";

record := pinstr;
   WHILE record DO BEGIN "pins"
      pinopr.task.display(pinopr,record,gpComplement);
      record := record.next; END "pins";

record := linstr;
   WHILE record DO BEGIN "lines"
      gpDrawLine(record.left,record.bottom,record.right,record.top,
         singleLineComp);
      record := record.next; END "lines";

END "delete it";

temp.cueflag := FALSE;

IF buttons NTST gpSelectButton THEN DONE "drag component";

newR13 := X2 + deltaX;
 newR23 := Y2 + deltaY;
 mat.r13 := oldMat.r11*newR13 + oldMat.r12*newR23 + oldMat.r13;
 mat.r23 := oldMat.r21*newR13 + oldMat.r22*newR23 + oldMat.r23;

temp.cueFlag := TRUE;

record := prmstr;
 WHILE record DO BEGIN "primitives"
    prmopr.task.display(prmopr,record,gpComplement);
    record := record.next; END "primitives";

record := pinstr;
 WHILE record DO BEGIN "pins"
    pinopr.task.display(pinopr,record,gpComplement);
    record := record.next; END "pins";

record := linstr;
 WHILE record DO BEGIN "lines"
    gpDrawLine(record.left,record.bottom,record.right,record.top,
       singleLineComp);
    record := record.next; END "lines";

END "drag Component";

gpPopMatrix;
Object := saveObject;

RETURN;

END "drag";

###############################################################################
#
#   This routine generates a new record.                                      #
#                                                                             #
###############################################################################

INTER(boundaryClass) PROCEDURE generate(
 POINTER(dataObjectClass) compHdr;     #Pointer to the comp object
 INTEGER msg;                           #Indicates the Msg of record
 REAL X1, Y1, X2, Y2, X3, Y3;           #Points for the new component
 );

BEGIN "generate"
```

```
POINTER(componentClass) cmp;              #Pointer to the component object
POINTER(dataObjectClass) symbol;
POINTER(dataObjectClass) group,order;
REAL deltaX,deltaY,centerX,centerY;
POINTER(tempComponentClass) temp;
POINTER(objectClass) saveObject;

temp := compHdr.temp;

IF NOT temp.defaultObject THEN $raise(DasActivateController);

saveObject := object;

accessdataObject(group,order,temp.defaultObject,orderMsg);
symbol := group.task.duplicate(group,order,allMsg);

object := saveObject;

cmp := new(componentClass);               #Allocate storage for new data object cmp.structure := symbol.structure;
cmp.type := symbol.type;

IF msg = special1MSG THEN BEGIN "left"
   centerX := temp.left;
   centerY := temp.bottom;
   END "left"

ELSE BEGIN "center"
   centerX := (temp.left + temp.right)/2.;
   centerY := (temp.bottom + temp.top)/2.;
   gpConvertToGrid(centerX,centerY,FALSE);
   END "center";

deltaX := X2 - centerX;
deltaY := Y2 - centerY;
cmp.left := temp.left + deltaX;           #Save left boundary
cmp.bottom := temp.bottom + deltaY;       #Save bottom boundary
cmp.right := temp.right + deltaX;         #Save right boundary
cmp.top := temp.top + deltaY;             #Save top boundary getDataOperator(cmp);                     #init the component.

order := cmp.structure;
WHILE order DOB
   cmp.task.move(cmp,order,allMsg,deltaX,deltaY);
   order := order.next;
   END;

RETURN(cmp);                              #Return pointer to the data object

END "generate";

################################################################################
                                                                               #
This module handles straight wires.  The structures are structure blasted      #
in from a library.                                                             #
                                                                               #
Wires Method Procedure                                                         #
                                                                               #
################################################################################

GIN "wirOpr"

RESTOREFROM "(application header)";
SOURCEFILE "(data class)";

MODULE(dataOperatorClass) wirOpr;

POINTER(wireSelectClass) emptyList;
POINTER(wireConnectClass) wireConnectEmpty;
```

```
POINTER(wireConnectClass) wireConnections;
POINTER(dataObjectClass) wireHdr;
POINTER(wirePointClass) wireTop;           #temp used in duplicate REAL fullDelta, halfDelta;                 #Used to hilite end points of record
REAL wirScreenInch;

REAL insDeltaX,insDeltaY;
REAL areaX1,areaX2,areaY1,areaY2;          #temporary area search numbers
BOOLEAN foundFlag;                         #found an item during area search
REAL pointX,pointY;                        #used to hold search location
POINTER(wirePointClass) foundParent;       #used to hold found wire pointer
POINTER(wirePointClass) foundChild;        #these are real temporary CLASS(temporaryClass) tempwireClass(       #Temporary data for wires
   REAL    cuePositionX1,                  #Temporary variable used for cue
           cuePositionY1,                  #Temporary variable used for cue
           cuePositionX2,                  #Temporary variable used for cue
           cuePositionY2;                  #Temporary variable used for cue
   INTEGER defaultwireRule;                #If no rule is present, choose this
   BOOLEAN north;                          #drags flags indicating dont go
   BOOLEAN south;                          # that way.
   BOOLEAN east;
   BOOLEAN west;
   BOOLEAN cuewire;                        #When TRUE wire drawn is deleted
   POINTER(wirePointClass) Aparent,Achild; #temp wire of lastWireGroupHead
   POINTER(wirePointClass) testwire1,testwire2; #used to hold wire points that
                                           # need to be tested to a dot.
   POINTER(wireClass) lastWireGroupHead;
   );

CLASS wireConnectClass(
   POINTER(wireConnectClass) next;
   POINTER(wirePointClass) thisPoint;
   POINTER(wireClass) headGroup;
   POINTER(wirePointClass) Aparent,Achild;
   );

##############################################################################
                                                                             #
This initial procedure informs the level of current wirOPR module release.   #
                                                                             #
##############################################################################

INITIAL PROCEDURE setUp;

BEGIN "setUp"
  ttywrite(" WIROPR: loading V2.1 released JAN. 27, 1984." & eol);
  RETURN;

END "setUp";

##############################################################################
                                                                             #
These procedures are for working the the wire group.                         #
                                                                             #
##############################################################################

POINTER(wirePointClass) PROCEDURE findRealParent(
POINTER(wirePointClass) child;
);

BEGIN "findRealParent"

POINTER(wirePointClass) parent;

DO BEGIN "loop"
   parent := child.back;
   IF NOT parent OR parent.wire = child THEN RETURN(parent);
   child := parent;
   END "loop";
END "findRealParent";
```

```
OCEDURE insertNewChild(
POINTER(wirePointClass) parent,child;
);

BEGIN "insertNewChild"

POINTER(wirePointClass) otherchildren;

IF NOT child THEN RETURN;
child.next := otherchildren := parent.wire;
parent.wire := child;
child.back := parent;
IF otherchildren THEN otherchildren.back := child;
RETURN;

END "insertNewChild";

OCEDURE insertNewParent(
POINTER(wireClass) header;
POINTER(wirePointClass) newparent;
);

BEGIN "insertNewParent"

POINTER(wirePointClass) parent;

parent := header.headwire;
header.headwire := newparent;
newparent.next := NULLPOINTER;
newparent.back := NULLPOINTER;
insertNewChild(newparent,parent);

RETURN;
END "insertNewParent";

OCEDURE removeChild(
POINTER(wireClass) header;
POINTER(wirePointClass) child;
);

BEGIN "removeChild"

POINTER(wirePointClass) parent,otherchildren;

parent := child.back;
child.back := NULLPOINTER;

IF otherchildren := child.next THEN otherchildren.back := parent;
child.next := NULLPOINTER;

IF parent THEN
   IF child = parent.next THEN parent.next := otherchildren
      ELSE parent.wire := otherchildren
ELSE
   IF header.headwire = child THEN header.headwire := NULLPOINTER
      ELSE notice(" WIROPR: this should never happen in REMOVE");
RETURN;
END "removeChild";

OCEDURE bringToTop(
POINTER(wireClass) header;
POINTER(wirePointClass) parent;
);

BEGIN "bringToTop"

POINTER(wirePointClass) grandParent,lastparent,nextParent;

IF header.headwire = parent THEN RETURN;
```

```
lastParent := parent;
nextParent := findRealParent(parent);
removeChild(header,parent);
WHILE nextParent DO BEGIN "loop"
   grandParent := findRealParent(nextParent);
   removechild(header,nextParent);        #remove child from parent
   insertNewchild(lastparent,nextParent); #add parent as a child to lastparent
   lastparent := nextParent;
   nextParent := grandparent;
   END "loop";

header.headwire := parent;
parent.back := NULLPOINTER;
parent.next := NULLPOINTER;

RETURN;

END "bringToTop";

OLEAN PROCEDURE searchWire(
POINTER(wirePointClass) wireParent;
);

BEGIN "searchWire"

POINTER(wirePointClass) wire;

wire := wireParent.wire;

WHILE wire DO BEGIN "search"
   IF wire.X = pointX THENB
      IF wire.Y = pointY THENB
         foundParent := wire;
         foundChild := NULLPOINTER;
         RETURN(TRUE);
         END
      EF wireparent.X = pointX AND wire.status NTST drawAsSubWire THENB
         IF wireparent.Y < wire.Y THENB
            IF wireparent.Y < pointY < wire.Y THENB
               foundParent := wireParent;
               foundChild := wire;
               RETURN(TRUE);
               END;
            END
         EF wireparent.Y > pointY > wire.Y THENB
            foundParent := wireParent;
            foundChild := wire;
            RETURN(TRUE);
            END;
         END;
      END
   EF wire.Y = pointY THENB
      IF wireparent.Y = pointY AND wire.status NTST drawAsSubWire THENB
         IF wireparent.X < wire.X THENB
            IF wireparent.X < pointX < wire.X THENB
               foundParent := wireParent;
               foundChild := wire;
               RETURN(TRUE);
               END;
            END
         EF wireparent.X > pointX > wire.X THENB
            foundParent := wireParent;
            foundChild := wire;
            RETURN(TRUE);
            END;
         END;
      END;

IF wire.wire AND wire.status NTST wirePointsToPins THEN
      IF searchWire(wire) THEN RETURN(TRUE);
   wire := wire.next;
   END "search";

RETURN(FALSE);
END "searchWire";
```

```
OLEAN PROCEDURE searchGroup(
POINTER(wireClass) wireHdr;
);

BEGIN "searchGroup"

POINTER(wirePointClass) wire;

IF wireHdr.left > pointX OR
   wireHdr.right < pointX OR
   wireHdr.bottom > pointY OR
   wireHdr.top < pointY THEN RETURN(FALSE);

wire := wireHdr.headWire;

IF wire.X = pointX AND wire.Y = pointY THENB
   foundParent := wire;
   foundChild := NULLPOINTER;
   RETURN(TRUE);
   END;

RETURN(searchWire(wireHdr.headWire));

END "searchGroup";

OLEAN PROCEDURE searchAllWires(
POINTER(dataObjectClass) wireHdr;
REAL X,Y;
PRODUCES POINTER(wireClass) wireGroupHead;
PRODUCES POINTER(wirePointClass) parent,child;
OPTIONAL REAL deltaX,deltaY;      ← OPTIONAL EXCEPTION
);

BEGIN "searchAllWires"            #go throught all the wire groups
                                  # and find this point
pointX := X + deltaX;
pointY := Y + deltaY;

wireGroupHead := wireHdr.structure;
WHILE wireGroupHead DO BEGIN "search groups"
   IF searchGroup(wireGroupHead) THENB
      parent := foundParent;
      child := foundChild;
      RETURN(TRUE);
      END;
   wireGroupHead := wireGroupHead.next;
   END "search groups";

parent := child := NULLPOINTER;
RETURN(FALSE);

END "searchAllWires";

##############################################################

PROCEDURE generates record select

##############################################################

POINTER(wireSelectClass) PROCEDURE getWireSelect;  #generate recordSelectClass.

BEGIN "getWireSelect"

POINTER(wireSelectClass) record;

IF emptyList THEN BEGIN "get off list"
   record := emptyList;
   emptyList := record.next;
   record.next := NULLPOINTER;
   END "get off list"
ELSE record := new(wireSelectClass);

RETURN(record);
END "getWireSelect";
```

```
##########################################################################

This routine dispose of the recordSelect by link on to a empty list

##########################################################################
       OCEDURE disposeWireSelect(              #dispose of a recordSelectCLass
       POINTER(wireSelectClass) record;
       );

BEGIN "disposeWireSelect"

IF record THEN BEGIN "save it"
          record.next := emptyList;
          emptyList := record;
          record.wire := NULLPOINTER;
          END "save it";
       RETURN;
       END "disposeWireSelect";

##########################################################################
                                                                          #
  This procedure is used to display the wire record.                      #
                                                                          #
##########################################################################
       OCEDURE wireDisplay(
       POINTER(wirePointClass) wireParent;
       );

BEGIN "wireDisplay"

POINTER(wirePointClass) wire;
       POINTER(wirePointClass) temp;

wire := wireParent.wire;

WHILE wire DO BEGIN "draw"

IF wire.status NTST drawAsSubWire THEN
             gpDrawLine(wireParent.X,wireParent.Y,wire.X,wire.Y,singleLine);

IF temp := wire.wire THEN BEGIN "doit"
             IF wire.status NTST wirePointsToPins THEN wireDisplay(wire);
             IF temp.next THEN
                gpAreaFill(wire.X-halfDelta,wire.Y-halfDelta,
                   wire.X+halfDelta,wire.Y+halfDelta,gpBlack);
             END "doit";

wire := wire.next;
          END "draw";
       RETURN;
       END "wireDisplay";

OCEDURE wireSelectDisplay(
       POINTER(wirePointClass) parent;
       );

BEGIN "wireSelectDisplay"
       POINTER(wirePointClass) wire,temp;

IF parent.status TST wireIsSelected THEN BEGIN "draw it"

wire := parent.wire;
          WHILE wire DO BEGIN "draw this one";
             IF wire.status NTST drawAsSubWire THEN
                gpDrawLine(parent.X,parent.Y,wire.X,wire.Y,singleLine);

IF temp := wire.wire THEN BEGIN "doit"
                IF wire.status NTST wirePointsToPins THEN wireSelectDisplay(wire);
                IF temp.next THEN
                   gpAreaFill(wire.X-halfDelta,wire.Y-halfDelta,
                      wire.X+halfDelta,wire.Y+halfDelta,gpBlack);
```

```
         END "doit";
       wire := wire.next;
       END "draw this one";
    RETURN;
    END "draw it"
ELSE BEGIN "cycle"

wire := parent.wire;
   WHILE wire DO BEGIN "loop"
      IF wire.status NTST drawAsSubWire AND
         wire.status TST wireIsSelected THEN
         gpDrawLine(parent.X,parent.Y,wire.X,wire.Y,singleLine);
      IF temp := wire.wire THEN BEGIN "doit"
         IF wire.status NTST wirePointsToPins THEN
            wireSelectDisplay(wire);
         IF temp.next THEN
            gpAreaFill(wire.X-halfDelta,wire.Y-halfDelta,
               wire.X+halfDelta,wire.Y+halfDelta,gpBlack);
         END "doit";
      wire := wire.next;
      END "loop";
   RETURN;
   END "cycle";
END "wireSelectDisplay";

POINTER(dataObjectClass) orderHdr;      #Pointer to the class header record
POINTER(boundaryClass) record;          #Pointer to a wire record
INTEGER msg;                            #Search status indicator
);

BEGIN "display"
POINTER(wirePointClass) wire,temp;
POINTER(tempWireClass) tmp;

ttywrite("DISPLAY - " & index[msg] & eol);

IF wirScreenInch <> gpCurrentWorldDensity THEN BEGIN "switch"
   wirScreenInch := gpCurrentWorldDensity;
   fullDelta := gpCurrentScreenInch / 20.;    #Set boundary for highlight
   halfDelta := gpCurrentScreenInch / 40.;    #Set boundary for highlight
   END "switch";

IF msg = selectMsg THENB "only select records"
   wire := record:wireClass.headWire;
   IF temp := wire.wire THEN BEGIN "doit"

IF wire.status NTST wirePointsToPins THEN wireSelectDisplay(wire);
      IF temp.next AND temp.next.next THEN
         gpAreaFill(wire.X-halfDelta,wire.Y-halfDelta,
         wire.X+halfDelta,wire.Y+halfDelta,gpBlack);
      END "doit";
   RETURN;

END "only select records"
ELSE BEGIN "all records"

wire := record:wireClass.headWire;

IF NOT wire THEN BEGIN "single wire display"
      gpDrawLine(record.left,record.bottom,record.right,record.top,singleLine);

tmp := orderHdr.temp;
      IF tmp.testwire1 AND
         tmp.testwire1.wire AND
         tmp.testwire1.wire:wirePointClass.next THEN
         gpAreaFill(tmp.testwire1.X-halfDelta,tmp.testwire1.Y-halfDelta,
            tmp.testwire1.X+halfDelta,tmp.testwire1.Y+halfDelta,gpBlack);
      IF tmp.testwire2 AND
         tmp.testwire2.wire AND
         tmp.testwire2.wire:wirePointClass.next THEN
         gpAreaFill(tmp.testwire2.X-halfDelta,tmp.testwire2.Y-halfDelta,
            tmp.testwire2.X+halfDelta,tmp.testwire2.Y+halfDelta,gpBlack);
      tmp.testwire1 := tmp.testwire2 := NULLPOINTER;
      END "single wire display"
```

```
      EF temp := wire.wire THEN BEGIN "doit"
         gpBox(record.left,record.bottom,record.right,record.top,singleLineDash);
      IF wire.status NTST wirePointsToPins THEN wireDisplay(wire);
      IF temp.next AND temp.next.next THEN
          gpAreaFill(wire.X-halfDelta,wire.Y-halfDelta,
            wire.X+halfDelta,wire.Y+halfDelta,gpBlack);
         END "doit";
      END "all records";
RETURN;

END "display";

##############################################################################
#
This procedure is used to erase the record off the screen.                   #
#                                                                            #
##############################################################################

OCEDURE wireErase(
POINTER(wirePointClass) wireParent;
);

BEGIN "wireErase"

POINTER(wirePointClass) wire;
POINTER(wirePointClass) temp;

wire := wireParent.wire;

WHILE wire DO BEGIN "draw"

IF wire.status NTST drawAsSubWire THEN
      gpDrawLine(wireParent.X,wireParent.Y,wire.X,wire.Y,singleLine,gpwhite);

IF temp := wire.wire THEN BEGIN "doit"
      IF wire.status NTST wirePointsToPins THEN wireErase(wire);
      IF temp.next THEN
         gpAreaFill(wire.X-halfDelta,wire.Y-halfDelta,
           wire.X+halfDelta,wire.Y+halfDelta,gpwhite);
      END "doit";

wire := wire.next;
   END "draw";
RETURN;
END "wireErase";

OCEDURE wireSelectErase(
POINTER(wirePointClass) parent;
);

BEGIN "wireSelectErase"
POINTER(wirePointClass) wire,temp;

IF parent.status TST wireIsSelected THEN BEGIN "draw it"

wire := parent.wire;
   WHILE wire DO BEGIN "draw this one";
      IF wire.status NTST drawAsSubWire THEN
         gpDrawLine(parent.X,parent.Y,wire.X,wire.Y,singleLine,gpwhite);

IF temp := wire.wire THEN BEGIN "doit"
         IF wire.status NTST wirePointsToPins THEN wireSelectErase(wire);
         IF temp.next THEN
            gpAreaFill(wire.X-halfDelta,wire.Y-halfDelta,
              wire.X+halfDelta,wire.Y+halfDelta,gpWhite);
         END "doit";
      wire := wire.next;
      END "draw this one";
   RETURN;
   END "draw it"
ELSE BEGIN "cycle"
```

```
    wire := parent.wire;
  WHILE wire DO BEGIN "loop"
    IF wire.status NTST drawAsSubWire AND
       wire.status TST wireIsSelected THEN
         gpDrawLine(parent.X,parent.Y,wire.X,wire.Y,singleLine,gpWhite);
    IF temp := wire.wire THEN BEGIN "doit"
       IF wire.status NTST wirePointsToPins THEN
         wireSelectErase(wire);
       IF temp.next THEN
          gpAreaFill(wire.X-halfDelta,wire.Y-halfDelta,
             wire.X+halfDelta,wire.Y+halfDelta,gpWhite);
       END "doit";
    wire := wire.next;
    END "loop";
  RETURN;
  END "cycle";
END "wireSelectErase";

OCEDURE erase(
POINTER(dataObjectClass) orderHdr;      #Pointer to the class header record
POINTER(boundaryClass) record;          #Pointer to a wire record
INTEGER msg;                            #Search status indicator
);

BEGIN "erase"

POINTER(wirePointClass) wire,temp;

#ttywrite("ERASE - " & index[msg] & eol);

IF msg = selectMsg OR msg = lastMsg THENB "only select records"
  wire := record:wireClass.headWire;
  IF temp := wire.wire THEN BEGIN "doit"

IF wire.status NTST wirePointsToPins THEN wireSelectErase(wire);
    IF temp.next AND temp.next.next THEN
        gpAreaFill(wire.X-halfDelta,wire.Y-halfDelta,
           wire.X+halfDelta,wire.Y+halfDelta,gpWhite);
    END "doit";
  RETURN;

END "only select records"
ELSE BEGIN "all records"

wire := record:wireClass.headWire;

IF temp := wire.wire THEN BEGIN "doit"
     gpBox(record.left,record.bottom,record.right,record.top,
        singleLineDash,gpwhite);
     IF wire.status NTST wirePointsToPins THEN wireErase(wire);
     IF temp.next AND temp.next.next THEN
        gpAreaFill(wire.X-halfDelta,wire.Y-halfDelta,
           wire.X+halfDelta,wire.Y+halfDelta,gpwhite);
     END "doit";
  END "all records";
RETURN;

END "erase";

################################################################
#
This procedure is used to highlight the wire record.           #
                                                               #
################################################################

OCEDURE wirePointHighLight(
POINTER(wirePointClass) wire;
);

BEGIN "wirePointHighLight"
POINTER(wirePointClass) next;
```

```
gpAreaFill(wire.X - fullDelta, wire.Y - fullDelta,
   wire.X + fullDelta, wire.Y + fullDelta, gpComplement);

next := findRealParent(wire);
IF next AND next.status TST wireIsSelected THENB
   gpDrawLine(next.X,next.Y,wire.X,wire.Y,
      singleLineComp);
   gpDrawLine (next.X,next.Y,wire.X,wire.Y,
      tripleLineComp);           #Complement outwire with .03 width
   END;

next := wire.wire;
WHILE next DO BEGIN "highLight it"
   IF next.status NTST wirePointsToPins AND
         next.status TST wireIsSelected THENB
      gpDrawLine(next.X,next.Y,wire.X,wire.Y,
         singleLineComp);
      gpDrawLine (next.X,next.Y,wire.X,wire.Y,
         tripleLineComp);        #Complement outwire with .03 width
      END;
   next := next.next;
   END "highLight it";
RETURN;
END "wirePointHighLight";

OCEDURE wireHighLight(
POINTER(wirePointClass) parent;
POINTER(wirePointClass) wire;
);

BEGIN "wireHighLight"
POINTER(wirePointClass) next;

IF wire.status TST wireIsSelected THEN BEGIN "high it"

gpAreaFill(wire.X - fullDelta, wire.Y - fullDelta,
      wire.X + fullDelta, wire.Y + fullDelta, gpComplement);

IF parent.status TST wireIsSelected THENB
      gpDrawLine(parent.X,parent.Y,wire.X,wire.Y,
         singleLineComp);
      gpDrawLine (parent.X,parent.Y,wire.X,wire.Y,
         tripleLineComp);        #Complement outwire with .03 width
      END;
   END "high it";

next := wire.wire;
WHILE next DO BEGIN "highLight it"
   IF next.status NTST wirePointsToPins THEN
      wireHighLight(wire,next);
   next := next.next;
   END "highLight it";
RETURN;
END "wireHighLight";

OCEDURE highLight(
POINTER(dataObjectClass) orderHdr;    #Pointer to the class header record
POINTER(boundaryClass) record;        #Pointer to a wire record
INTEGER msg;                          #The status indicator for search
);

BEGIN "highLight"

POINTER(wirePointClass) next;
POINTER(wirePointClass) wire;

#ttywrite("HIGHLIGH - " & index[msg] & eol);

IF msg = selectMsg THENB "only select records"

wire := record:wireClass.headwire;
```

```
   IF wire.status TST wireIsSelected THEN
      gpAreaFill(wire.X - fullDelta, wire.Y -.fullDelta,
        wire.X + fullDelta, wire.Y + fullDelta, gpComplement);

next := wire.wire;
   WHILE next DO BEGIN "highLight it"
      IF next.status NTST wirePointsToPins THEN
         wireHighLight(wire,next);
      next := next.next;
      END "highLight it";

END "only select records";
   RETURN;

END "highLight";

###########################################################################
#                                                                         #
   This procedure is used to delete any highlights of the wire record.    #
#                                                                         #
#####################################################################

ROCEDURE unHighLight(
   POINTER(dataObjectClass) orderHdr;     #Pointer to the class header record
   POINTER(boundaryClass) record;         #Pointer to a wire record
   INTEGER msg;                           #The status indicator for search
   );

BEGIN "unHighLight"

#ttywrite("UNHIGHLIGH - " & index[msg] & eol);

highLight(orderHdr,record,msg);
RETURN;

END "unHighLight";

###########################################################################
#                                                                         #
   This procedure is used to generate temporary record for the wire class.#
#                                                                         #
#####################################################################

ROCEDURE initialize(
   POINTER(dataObjectClass) orderHdr;    #Pointer to the class header record
   );

BEGIN "initialize"

POINTER(wireClass) record;

IF NOT orderHdr.temp THEN
   orderHdr.temp := new(tempwireClass);
                                       #Allocate and point to a new temp rec
orderHdr.temp:tempwireClass.defaultwireRule := 0;
                                       #Set this to be the default for draw
record := orderHdr.structure;
WHILE record DO BEGIN "init wires"
   record.temp := new(tempWireSelectClass);
   record := record.next;
   END "init wires";

RETURN;

END "initialize";
```

```
##########################################################################
                                                                         #
  This procedure is used to activate a record for an operation.          #
                                                                         #
##########################################################################

PROCEDURE activate(
  POINTER(dataObjectClass) orderHdr;    #Pointer to the class header record
  POINTER(boundaryClass) record;        #Pointer to the wire record
  INTEGER msg;
  );

BEGIN "activate"

#ttywrite("ACTIVATE - " & index[msg] & eol);
  RETURN;

END "activate";

##########################################################################
                                                                         #
  This procedure is used to find a record to perform an operation.       #
                                                                         #
##########################################################################

BOOLEAN PROCEDURE find(
  MODIFIES POINTER(dataObjectClass) orderHdr;
                                        #Pointer to the class header record
  PRODUCES POINTER(dataObjectClass) record; #Pointer to the wire record
  INTEGER status;                       #The status indicator for search
  );

BEGIN "find"

#ttywrite("FIND - " & index[status] & eol);
  RETURN(FALSE);

END "find";

##########################################################################
                                                                         #
  This procedure is used to deactivate a record after a successful oprn. #
                                                                         #
##########################################################################

PROCEDURE deactivate(
  POINTER(dataObjectClass) orderHdr;    #Pointer to the class header record
  POINTER(boundaryClass) record;        #Pointer to the wire record
  INTEGER msg;
  );

BEGIN "deactivate"

#ttywrite("DEACTIVATE - " & index[msg] & eol);
  RETURN;

END "deactivate";

##########################################################################
                                                                         #
  This procedure is used to clean up the temporary record for wire header. #
                                                                         #
##########################################################################

PROCEDURE cleanUp(
  POINTER(dataObjectClass) orderHdr;    #Pointer to the class header record
  INTEGER msg;
  );

BEGIN "cleanUp"

POINTER(wireClass) wire;
```

```
orderHdr.temp := NULLPOINTER;           #Remove pointer to wires data object
                                        # temporary area
wire := orderHdr.structure;

WHILE wire DO BEGIN "loop"
   wire.temp := NULLPOINTER;
   wire := wire.next;
   END "loop";

RETURN;

END "cleanUp";

########################################################################
#
# This procedure is used to drag a wire around for a cue.              #
#                                                                      #
########################################################################

PROCEDURE drag(
POINTER(dataObjectClass) orderHdr;      #Pointer to the class header record
REAL X1, Y1;                            #Value of one point for a total move
MODIFIES REAL X2, Y2, X3, Y3;           #The new points as cursor is dragged
MODIFIES INTEGER status;                #The status indicator for search
OPTIONAL POINTER(boundaryClass) record;    #Pointer to wire record
);

BEGIN "drag"

BOOLEAN isTotal;                        #TRUE when the point is not end point
POINTER(tempwireClass) temp;            #Pointer to temporary wire area
BITS buttons;                           #When nonzero procedure is exited
INTEGER keyBoard;                       #The state indicates when to drag
REAL deltaX1, deltaY1, deltaX2, deltaY2;   #Deltas used for a move/copy
POINTER(wireClass) AwireGroupHead;
POINTER(wirePointClass) Aparent,Achild,next;

#ttywrite("DRAG - " & index[status] & eol);

X3 := Y3 := 0.;                         #Initialize third coordinate
deltaX1 := deltaY1 := deltaX2 := deltaY2 := 0.;    #Initialize deltas
isTotal := FALSE;                       #Initialize total record indicator temp := orderHdr.temp;                  #Get the pointer to temporary area temp.east := FALSE;
temp.west := FALSE;
temp.north := FALSE;
temp.south := FALSE;

IF record THEN
   BEGIN "get information from record" #The record has information in it
   IF record:wireClass.temp AND
      record:wireClass.temp.selectParent AND
      record:wireClass.temp.selectChild THEN BEGIN "move line"

deltaX1 := X1 - record:wireClass.temp.selectParent.X;
               #Delta x value for the first point
      deltaY1 := Y1 - record:wireClass.temp.selectParent.Y;
               #Delta y value for the first point
      deltaX2 := X1 - record:wireClass.temp.selectChild.X;
               #Delta x value for the second point
      deltaY2 := Y1 - record:wireClass.temp.selectChild.Y;
               #Delta y value for the second point
```

```
    END "move line"

ELSE BEGIN "move point"
    DO BEGIN "drag loop"
       handleInput(X2,Y2,buttons,keyBoard,handleStreamInput);
                                        #Get next set of inputs as you drag
       IF temp.cuewire THENB
          gpDrawLine(1E35,temp.cuePositionY1,
             -1E35,temp.cuePositionY1,singleLineComp);
          gpDrawLine(temp.cuePositionX1,1E35,temp.cuePositionX1,-1E35,
             singleLineComp);
          END;
                                        #Draw wire with complement rule
       temp.cuewire := FALSE;           #When true, wire drawn is deleted
       IF buttons NTST gpSelectButton THEN DONE "drag loop";
                                        #Exit if any keyboard button is hit
       temp.cuewire := TRUE;            #Set to true so wire can be deleted
       temp.cuePositionX1 := X2;
       temp.cuePositionY1 := Y2;

gpDrawLine(1E35,temp.cuePositionY1,
          -1E35,temp.cuePositionY1,singleLineComp);
       gpDrawLine(temp.cuePositionX1,1E35,temp.cuePositionX1,-1E35,
          singleLineComp);
                                        #Draw wire with complement rule
       END "drag loop";
    END "move point";
 END "get information from record"

ELSE BEGIN "new record"                 #This is a brand new record
   IF searchAllWires(orderHdr,X1,Y1, AwireGroupHead,Aparent,Achild) THENB
      temp.lastWireGroupHead := AwireGroupHead;
      temp.Aparent := Aparent;
      temp.Achild := Achild;
      END
   EF temp.lastWireGroupHead THENB
      temp.Aparent := temp.lastWireGroupHead.headwire;
      temp.Achild := NULLPOINTER;
      END
   ELSE BEGIN
      temp.Aparent := NULLPOINTER;
      temp.Achild := NULLPOINTER;
      END;
IF temp.lastWireGroupHead THEN BEGIN "find ends"
   IF temp.Aparent AND NOT temp.Achild THEN BEGIN "find all directions"

temp.cuePositionX1 := temp.Aparent.X;
      temp.cuePositionY1 := temp.Aparent.Y;

IF next := findRealParent(temp.Aparent) THEN BEGIN "test back pointer"

IF temp.Aparent.X = next.X AND temp.Aparent.Y > next.Y THEN
            temp.south := TRUE;
         IF temp.Aparent.X = next.X AND temp.Aparent.Y < next.Y THEN
            temp.north := TRUE;
         IF temp.Aparent.Y = next.Y AND temp.Aparent.X > next.X THEN
            temp.west := TRUE;
         IF temp.Aparent.Y = next.Y AND temp.Aparent.X < next.X THEN
            temp.east := TRUE;
         END "test back pointer";
      next := temp.Aparent.wire;    #THis will restrict the draging.
      WHILE next DO BEGIN "search all"
         IF temp.Aparent.X = next.X AND temp.Aparent.Y > next.Y THEN
            temp.south := TRUE;
         IF temp.Aparent.X = next.X AND temp.Aparent.Y < next.Y THEN
            temp.north := TRUE;
         IF temp.Aparent.Y = next.Y AND temp.Aparent.X > next.X THEN
            temp.west := TRUE;
         IF temp.Aparent.Y = next.Y AND temp.Aparent.X < next.X THEN
            temp.east := TRUE;
         next := next.next;
         END "search all";
      END "find all directions"
```

```
  EF temp.Aparent AND temp.Achild THEN BEGIN "insert in middle"
     temp.cuePositionX1 := X1;
     temp.cuePositionY1 := Y1;
     IF temp.Aparent.X = temp.Achild.X THEN
        temp.north := temp.south := TRUE;
     IF temp.Aparent.Y = temp.Achild.Y THEN
        temp.east := temp.west := TRUE;
     END "insert in middle";
  END "find ends"
ELSE BEGIN
  temp.cuePositionX1 := X1;            #Initialize delta x for first point
  temp.cuePositionY1 := Y1;            #Initialize delta y for first point
  END;
status := allRecord;                   #Indicate entire record as selected DO BEGIN "drag loop"
  handleInput(X2,Y2,buttons,keyBoard,handleStreamInput);
                                       #Get next set of inputs as you drag
  IF temp.cuewire THEN
     gpDrawLine(temp.cuePositionX1,temp.cuePositionY1,
        temp.cuePositionX2,temp.cuePositionY2,singleLineComp);
                                       #Draw wire with complement rule
  temp.cuewire := FALSE;               #When true, wire drawn is deleted IF NOT isTotal THEN
     IF temp.south AND Y2 < temp.cuePositionY1 THEN Y2 := temp.cuePositionY1;
     IF temp.north AND Y2 > temp.cuePositionY1 THEN Y2 := temp.cuePositionY1;
     IF temp.east  AND X2 > temp.cuePositionX1 THEN X2 := temp.cuePositionX1;
     IF temp.west  AND X2 < temp.cuePositionX1 THEN X2 := temp.cuePositionX1;

IF abs(X2-temp.cuePositionX1) > abs(Y2-temp.cuePositionY1) THEN
        Y2 := temp.cuePositionY1
     ELSE X2 := temp.cuePositionX1;    #make it straight IF buttons NTST gpSelectButton THEN DONE "drag loop";
                                       #Exit if any keyboard button is hit
  IF isTotal THEN
     BEGIN "wire drag"                 #Drag the entire wire record
     temp.cuePositionX1 := X2 - deltaX1;   #New x position of first pt
     temp.cuePositionY1 := Y2 - deltaY1;   #New y position of first pt
     END "wire drag";

temp.cuePositionX2 := X2 - deltaX2;  #New x position of second pt
  temp.cuePositionY2 := Y2 - deltaY2;  #New y position of second pt temp.cuewire := TRUE;                #Set to true so wire can be deleted gpDrawLine(temp.cuePositionX1,temp.cuePositionY1,
     temp.cuePositionX2,temp.cuePositionY2,singleLineComp);
                                       #Draw wire with complement rule
  END "drag loop";

END "new record";

IF NOT record AND
  temp.lastwireGroupHead AND           #if end of line equals to beginning
  X2 = temp.cuePositionX1 AND          # then reset the last wire group.
  Y2 = temp.cuePositionY1 THENB
  temp.lastWireGroupHead := NULLPOINTER;
  X2 := X1;
  Y2 := Y1;
  END;

RETURN;
END "drag";
########################################################################
                                                                       #
This procedure is used to generate a new wire record.                  #
                                                                       #
########################################################################

INTER(boundaryClass) PROCEDURE generate(
POINTER(dataObjectClass) orderHdr;     #Pointer to the class header record
INTEGER status;                        #The status indicator for search
REAL X1, Y1, X2, Y2, X3, Y3;           #Coordinates of the wire record
```

```
.);

BEGIN "generate"

POINTER(wireClass) wire;                    #Pointer to wire records
POINTER(tempwireClass) temp;                #Pointer to temporary area ttywrite("GENERATE - " & index[status] & eol);
temp := orderHdr.temp;                      #Get temporary record data wire := new(wireClass);                     #Allocate and point to a new record IF temp.lastWireGroupHead AND
   temp.lastWireGroupHead.headwire THENB IF temp.Aparent AND NOT temp.Achild THENB
      wire.left := temp.Aparent.X;
      wire.bottom := temp.Aparent.Y;
      END;
   IF temp.Aparent AND temp.Achild THENB
      wire.left := X1;
      wire.bottom := Y1;
      END;
   END
ELSE BEGIN
   wire.left := X1;                         #Save x-coordinate of the first pnt
   wire.bottom := Y1;                       #Save y-coordinate of the first pnt
   END;

wire.right := X2;                           #Save x-coordinate of the second pnt
wire.top := Y2;                             #Save y-coordinate of the second pnt
wire.nextRev := NULLPOINTER;
wire.headWire := NULLPOINTER;
wire.node := NULLPOINTER;
wire.temp := new(tempWireSelectClass);

RETURN(wire);                               #Return pointer to the new record

END "generate";

################################################################
#
  This procedure is used for updating a record.                #
#                                                              #
################################################################

BOOLEAN PROCEDURE update(
   POINTER(dataObjectClass) orderHdr;       #Pointer to the class header record
   POINTER(boundaryClass) record;           #Pointer to a wire record
   USES INTEGER status;                     #Status indicator for search
   USES STRING fieldName;                   #Menu selector item
   USES STRING newValue;                    #New value of rule, etc.
   );

BEGIN "update"

BOOLEAN isUpdated;                          #TRUE when the rule is updated ttywrite("UPDATE - " & index[status] & eol);
IF status <> allRecord THEN RETURN(FALSE);  #Return on wrong status
isUpdated := FALSE;                         #Initialize record update indicator IF equ(fieldName,"DEFAULTWIRERULE",upperCase) THEN
   BEGIN "update default wire rule"         #Update wire record
   orderHdr.temp:tempwireClass.defaultwireRule := cvi(newValue);
                                            #Set to the new default rule given
   isUpdated := TRUE;                       #Set as updated
   END "update default wire rule";

RETURN(isUpdated);

END "update";
```

```
###############################################################
                                                              #
This procedure is used for moving a wire record.              #
                                                              #
###############################################################

PROCEDURE moveWire(
POINTER(wirePointClass) wire;
);

BEGIN "moveWire"

IF wire.status TST wireIsSelected THEN BEGIN "moveThisOne"
    wire.X .+ pointX;                     #move it
    wire.Y .+ pointY;
    END "moveThisOne";

areaX1 .MIN wire.X;                       #push out boundary box
areaX2 .MAX wire.X;
areaY1 .MIN wire.Y;
areaY2 .MAX wire.Y;

IF wire.wire AND wire.status NTST wirePointsToPins THENB "test others"
    wire := wire.wire;

WHILE wire DO BEGIN "search"          #cycle down tree
        moveWire(wire);
        wire := wire.next;
        END "search";
    END "test others";

RETURN;
END "moveWire";

PROCEDURE moveALLWire(
POINTER(wirePointClass) wire;
);

BEGIN "moveAllWire"

wire.x .+ pointX;                         #move every point
wire.y .+ pointY;

IF wire.wire AND wire.status NTST wirePointsToPins THENB "test others"
    wire := wire.wire;

WHILE wire DO BEGIN "search"          #cycle down tree
        moveAllWire(wire);
        wire := wire.next;
        END "search";
    END "test others";

RETURN;
END "moveAllWire";

PROCEDURE move(
POINTER(dataObjectClass) orderHdr;        #Pointer to the class header record
POINTER(boundaryClass) record;            #Pointer to a wire record
USES INTEGER msg;                         #Status indicator for search
REAL deltaX, deltaY;                      #Delta values for the point for move
);

BEGIN "move"

POINTER(wirePointClass) wire;

#ttywrite("MOVE - " & index[msg] & eol);
IF msg = selectMsg THEN BEGIN "move selected"
    pointX := deltaX;                     #save deltas in global areas for speed
    pointY := deltaY;
    wire := record:wireClass.headwire;
    IF wire.status TST wireIsSelected THENB
        areaX1 := areaX2 := wire.X + deltaX; #reset new boundarys of this wire
        areaY1 := areaY2 := wire.Y + deltaY;
```

```
  ELSE BEGIN
     areaX1 := areaX2 := wire.X;          #reset new boundarys of this wire
     areaY1 := areaY2 := wire.Y;
  END;

moveWire(wire);                         #move all selected points
  record.left := areaX1;                  #save new boundary box
  record.right := areaX2;
  record.bottom := areaY1;
  record.top := areaY2;
  END "move selected"                     reconnect(ordrtth, record);

EF msg = allMsg THEN BEGIN "move all"
  pointX := deltaX;                       #save deltas in global areas
  pointY := deltaY;
  moveAllwire(record:wireClass.headwire);
  record.left .+ deltaX;                  #move boundary box.
  record.right .+ deltaX;
  record.bottom .+ deltaY;
  record.top .+ deltaY;

END "move all";
RETURN;

END "move";

#############################################################################
                                                                            #
  This procedure is used for copying a wire record.                         #
                                                                            #
#############################################################################

)INTER(wirePointClass) PROCEDURE DupWire(
POINTER(wirePointClass) wire;
);

BEGIN "DupWire"
POINTER(wirePointClass) newWire;
POINTER(wirePointClass) ptr1,ptr2;

newWire := new(wirePointClass);
newWire.X := wire.x;
newWire.Y := wire.y;
newWire.status := wire.status;

IF wire.wire AND wire.status NTST wirePointsToPins THENB "test others"
   ptr1 := wire.wire;

WHILE ptr1 DO BEGIN "search"
      ptr2 := DupWire(ptr1);
      IF ptr2 THEN insertNewChild(newWire,ptr2);
      ptr1 := ptr1.next;
      END "search";
   END "test others";

RETURN(newWire);
END "DupWire";

INTER(wirePointClass) PROCEDURE DupSelectedWire(
POINTER(wirePointClass) wire;
);

BEGIN "DupSelectedWire"
POINTER(wirePointClass) newWire;
POINTER(wirePointClass) ptr1,ptr2;

IF wire.status TST wireIsSelected THEN BEGIN "dup me"
   newWire := new(wirePointClass);
   newWire.X := wire.x;
   newWire.Y := wire.y;
   newWire.status := wire.status;

IF wire.wire AND wire.status NTST wirePointsToPins THENB "test others"
      ptr1 := wire.wire;
```

```
    WHILE ptr1 DO BEGIN "search"
       IF ptr1.status TST wireIsSelected THEN BEGIN "get him"
          ptr2 := DupSelectedWire(ptr1);
          IF ptr2 THEN insertNewChild(newWire,ptr2);
          END "get him"
       ELSE ptr2 := DupSelectedWire(ptr1);
       ptr1 := ptr1.next;
       END "search";
    END "test others";
  END "dup me"
ELSE BEGIN "find first select"
   IF wire.wire AND wire.status NTST wirePointsToPins THENB "test others"
      ptr1 := wire.wire;

WHILE ptr1 DO BEGIN "search"
         IF newWire := DupSelectedWire(ptr1) AND newWire.wire THENB
            newWire.next := wireTop;
            wireTop := newWire;
            END;
         ptr1 := ptr1.next;
         END "search";
      END "test others";
   newWire := NULLPOINTER;
   END "find first select";

RETURN(newWire);
END "DupSelectedWire";

INTER (boundaryClass) PROCEDURE duplicate(
POINTER(dataObjectClass) orderHdr;      #Pointer to the class header record
POINTER(boundaryClass) record;          #Pointer to a wire record
USES INTEGER msg;                       #Status indicator for search
);

BEGIN "duplicate"

POINTER(wireClass) wire;                #Pointer to a wire record
POINTER(wirePointClass) lastwire;

#ttywrite("DUPLICATE - " & index[msg] & eol);

wire := new(wireClass);                 #Allocate and point to a new record
wire.left := record.left;               #New x-coordinate of the first pnt
wire.bottom := record.bottom;           #New y-coordinate of the first pnt
wire.right := record.right;             #New x-coordinate of the second pnt
wire.top := record.top;                 #New y-coordinate of the second pnt
wire.headwire := NULLPOINTER;
wire.temp := new(tempWireSelectClass);

IF msg = allMsg THEN BEGIN "dup all"
   wire.headwire := dupWire(record:wireClass.headwire);
   END "dup all"
EF msg = selectMsg THEN BEGIN "dup Select"
   lastWire := DupSelectedWire(record:wireClass.headwire);
   wire.headWire := wireTop;
   IF lastWire THENB
      lastWire.next := wire.headWire;
      wire.headWire := lastWire;
      END;
   END "dup Select";

IF wire.headwire THEN RETURN(wire)      #Return pointer to the new recordi
   ELSE RETURN(NULLPOINTER);

END "duplicate";

##################################################################
                                                                 #
This procedure is used for adding wire records to other existing records. #
                                                                 #
##################################################################

ROCEDURE connectSearch(
POINTER(dataObjectClass) orderHdr;
```

```
POINTER(wirePointClass) wire;
);

BEGIN "connectSearch"
POINTER(wireClass) head;
POINTER(wirePointClass) parent,child;
POINTER(wireConnectClass) connect,tmp;

IF searchAllWires(orderHdr,wire.X,wire.Y,
   head,parent,child,insDeltaX,insDeltaY) THEN
   BEGIN "save this one"

tmp := wireConnections;              #check for a connections
   WHILE tmp AND tmp.headGroup <> head DO tmp := tmp.next;
   IF tmp THEN
      notice("WARNING: Can NOT connect a wire to itself.")

ELSE BEGIN "insert"
      IF wireConnectEmpty THENB         #get new record.
         connect := wireConnectEmpty;
         wireConnectEmpty := connect.next;
         END
      ELSE connect := new(wireConnectClass);

connect.thisPoint := wire;        #save information
      connect.headGroup := head;
      connect.Aparent := parent;
      connect.Achild := child;

connect.next := wireConnections;  #link it up.
      wireConnections := connect;
      END "insert";
   END "save this one";

wire.status .! wireIsSelected;          #set select bit.

IF wire.wire AND wire.status NTST wirePointsToPins THENB "test others"
   wire := wire.wire;

WHILE wire DO BEGIN "search"
      connectSearch(orderHdr,wire);
      wire := wire.next;
      END "search";
   END "test others";

RETURN;
END "connectSearch";

CEDURE insert(
POINTER(dataObjectClass)    d  Hdr;     #Pointer to the class header record
POINTER(boundaryClass) record;          #Pointer to a w   record
INTEGER status;                         #The status indicator for search
);

BEGIN "insert"

POINTER(wireClass) AwireGroupHead,BWireGroupHead;
POINTER(wirePointClass) Awire,Aparent,Achild,saveWire;
POINTER(wirePointClass) Bwire,Bparent,Bchild,next;
POINTER(wireConnectClass) tempCont;
BOOLEAN AfoundFlag,BfoundFlag;

POINTER(tempWireClass) temp;
POINTER(recordSelectClass) select,lastSelect;
REAL tmp;

IF status = connectMsg THEN RETURN;

#ttywrite("INSERT - " & index[status] & eol);
IF record:wireClass.headWire THEN BEGIN "insert structure"
   saveWire := record:wireClass.headWire.next;
   record:wireClass.headWire.next := NULLPOINTER;

insDeltaX := object.selectedItem:selectClass.x1;
   insDeltaY := object.selectedItem:selectClass.y1;
```

```
wireConnections := NULLPOINTER;
connectSearch(orderHdr,record:wireClass.headWire);

WHILE wireConnections DO BEGIN "connect trees"
   IF wireConnections.Achild THEN BEGIN "insert in middle"
      removeChild(wireConnections.headGroup,wireConnections.Achild);
      bringToTop(wireConnections.headGroup,wireConnections.Aparent);
      insertNewChild(wireConnections.thisPoint,wireConnections.Aparent);
      insertNewChild(wireConnections.thisPoint,wireConnections.Achild);
      END "insert in middle"

ELSE BEGIN "insert on end"
      bringToTop(wireConnections.headGroup,wireConnections.Aparent);
      Achild := wireConnections.Aparent.wire;
      WHILE Achild DO BEGIN "insert parents children"
         removeChild(wireConnections.headGroup,Achild);
         insertNewChild(wireConnections.thisPoint,Achild);
         Achild := wireConnections.Aparent.wire;
         END "insert parents children"
      END "insert on end";

record.left .MIN wireConnections.headGroup.left;
   record.right .MAX wireConnections.headGroup.right;
   record.bottom .MIN wireConnections.headGroup.bottom;
   record.top .MAX wireConnections.headGroup.top;

select := orderHdr.temp.select;
   lastSelect := NULLPOINTER;

WHILE select AND select.record <> wireConnections.headGroup DO
      lastSelect := select; select := select.next; END;

IF select THEN "unselect it"
      IF lastSelect THEN lastSelect.next := select.next
         ELSE orderHdr.temp.select := select.next;
      disposeSelect(select);
      object.selectedItem:selectClass.selectCount .-1;
      END "unselect it";

remove(orderHdr,wireConnections.headGroup,NULLPOINTER,allMsg);

tempCont := wireConnections.next;
   wireConnections.next := wireConnectEmpty;
   wireConnectEmpty := wireConnections;
   wireConnections := tempCont;

END "connect trees";
   record.next := orderHdr.structure;    #Save current pointer as the next ptr
   orderHdr.structure := record;         #The current record is now the top
   IF NOT record:wireClass.temp THEN
      record:wireClass.temp := new(tempwireSelectClass);
   END "insert structure"

ELSE BEGIN "insert single wire"

temp := orderHdr.temp;

IF temp.lastwireGroupHead AND
      record.left = temp.lastWireGroupHead.headWire.X AND
      record.bottom = temp.lastWireGroupHead.headWire.Y THEN
      AfoundFlag := TRUE;
      AwireGroupHead := temp.lastWireGroupHead;
      Achild := temp.Achild;
      IF NOT Aparent := temp.Aparent THEN
         Aparent := temp.lastWireGroupHead.headwire;
         Achild := NULLPOINTER;
         END;
      temp.lastWireGroupHead := NULLPOINTER;
      END
   ELSE AfoundFlag := searchAllWires(orderHdr,record.left,record.bottom,
      AwireGroupHead,Aparent,Achild);
   BfoundFlag := searchAllWires(orderHdr,record.right,record.top,
      BwireGroupHead,Bparent,Bchild);
```

```
IF NOT AfoundFlag AND NOT BfoundFlag THEN BEGIN "new group"

record.next := orderHdr.structure;#inset wire group header
   orderHdr.structure := record;
   record:wireClass.temp := new(tempwireSelectClass);

Awire := new(wirePointClass);
   Awire.Status := cvb(temp.defaultwireRule);
   Awire.X := record.left;
   Awire.Y := record.bottom;
   Bwire := new(wirePointClass);
   Bwire.status := '0;
   Bwire.X := record.right;
   Bwire.Y := record.top;
   insertNewChild(Bwire,Awire);
   insertNewParent(record,Bwire);
   temp.lastWireGroupHead := record;

tmp := record.left MIN record.right; #make into proper box
   record.right := record.left MAX record.right;
   record.left := tmp;

tmp := record.bottom MIN record.top;
   record.top := record.bottom MAX record.top;
   record.bottom := tmp;

RETURN;
   END "new group";

IF BfoundFlag AND NOT Bchild THEN BEGIN "test B side"

temp.east := FALSE;
   temp.west := FALSE;
   temp.north := FALSE;
   temp.south := FALSE;

IF next := findRealParent(Bparent) THEN BEGIN "test back pointer"

IF Bparent.X = next.X AND Bparent.Y > next.Y THEN
         temp.south := TRUE;
      IF Bparent.X = next.X AND Bparent.Y < next.Y THEN
         temp.north := TRUE;
      IF Bparent.Y = next.Y AND Bparent.X > next.X THEN
         temp.west := TRUE;
      IF Bparent.Y = next.Y AND Bparent.X < next.X THEN
         temp.east := TRUE;
      END "test back pointer";

next := Bparent.wire;  #THis will restrict the dragging.
   WHILE next DO BEGIN "search all"
      IF Bparent.X = next.X AND Bparent.Y > next.Y THEN
         temp.south := TRUE;
      IF Bparent.X = next.X AND Bparent.Y < next.Y THEN
         temp.north := TRUE;
      IF Bparent.Y = next.Y AND Bparent.X > next.X THEN
         temp.west := TRUE;
      IF Bparent.Y = next.Y AND Bparent.X < next.X THEN
         temp.east := TRUE;
      next := next.next;
      END "search all";
   IF (temp.south AND Bparent.Y > record.bottom) OR
      (temp.north AND Bparent.Y < record.bottom) OR
      (temp.east AND Bparent.X < record.left) OR
      (temp.west AND Bparent.X > record.left) THENB
      notice("WARNING: Can NOT connect a wire in that manner.");
      record.left := record.right;
      record.bottom := record.top;     #test for insert a wire that has the
      temp.lastWireGroupHead := NULLPOINTER;
      RETURN;                          #as slope.
      END;
   END "test B side";
```

```
IF AfoundFlag AND BfoundFlag AND AwireGroupHead = BwireGroupHead THENB
   notice("WARNING: Can NOT connect a wire to itself.");
   record.left := record.right;       #zero record so it will not display.
   record.bottom := record.top;
   temp.lastWireGroupHead := NULLPOINTER;
   RETURN;                            #need to fix this
   END;

IF NOT AfoundFlag AND BfoundFlag THEN BEGIN "found B only"
   tmp := record.left;
   record.left := record.right;
   record.right := tmp;               #swap A and B tmp := record.bottom;
   record.bottom := record.top;
   record.top := tmp;

AfoundFlag := TRUE;
   BfoundFlag := FALSE;
   AwireGroupHead := BwireGroupHead;
   Aparent := Bparent;
   Achild := Bchild;

END "found B only";

IF BfoundFlag AND bchild THEN BEGIN "test insert in middle"
   IF (Bparent.X = Bchild.X AND record.left = record.right) OR
      (Bparent.Y = Bchild.Y AND record.bottom = record.top) THENB
      notice("WARNING: Can NOT connect a wire in that manner.");
      record.left := record.right;
      record.bottom := record.top;    #test for insert a wire that has the
      temp.lastWireGroupHead := NULLPOINTER;
      RETURN;                         #as slope.
      END;
   END "test insert in middle";

IF Achild THEN BEGIN "insert middle"

IF (Aparent.X = Achild.X AND record.left = record.right) OR
      (Aparent.Y = Achild.Y AND record.bottom = record.top) THENB
      notice("WARNING: Can NOT connect a wire in that manner.");
      record.left := record.right;
      record.bottom := record.top;    #test for insert a wire that has the
      temp.lastWireGroupHead := NULLPOINTER;
      RETURN;                         #as slope.
      END;
   removeChild(AwireGroupHead,Achild); #remove child
   Awire := new(wirePointClass);      #generate first point
   Awire.Status := cvb(temp.defaultwireRule);
   Awire.X := record.left;
   Awire.Y := record.bottom;
   temp.testwire1 := Awire;

AwireGroupHead.left .MIN record.left;
   AwireGroupHead.right .MAX record.left;
   AwireGroupHead.bottom .MIN record.bottom;
   AwireGroupHead.top .MAX record.bottom;

insertNewChild(Aparent,Awire);     #insert wire as a child.
   insertNewChild(Awire,Achild);      #insert oldchild as a child of wire.
   bringToTop(AwireGroupHead,Awire);
   END "insert middle"

ELSE BEGIN "found end point"
   bringToTop(AwireGroupHead,Aparent);
   temp.testwire1 := Aparent;
   END "found end point";

IF NOT BfoundFlag THEN BEGIN "add other end"

Bwire := new(wirePointClass);      #generate other end point
   Bwire.status := '0;
   Bwire.X := record.right;
   Bwire.Y := record.top;             #set up status for this wire;
```

```
    AwireGroupHead.left .MIN record.right;
    AwireGroupHead.right .MAX record.right;
    AwireGroupHead.bottom .MIN record.top;
    AwireGroupHead.top .MAX record.top;

insertNewParent(AwireGroupHead,Bwire);
    temp.lastWireGroupHead := AwireGroupHead;

RETURN;
    END "add other end"

ELSE BEGIN "tie two wire groups together"
  IF Bchild THEN BEGIN "insert middle"

removeChild(BwireGroupHead,Bchild); #remove child.
    Bwire := new(wirePointClass);    #generate first point
    Bwire.Status := Bchild.status;
    Bwire.X := record.right;
    Bwire.Y := record.top;

insertNewChild(Bparent,Bwire);   #insert wire as a child.
    insertNewChild(Bwire,Bchild);    #insert oldchild as a child of wire.
    END "insert middle"
  ELSE Bwire := Bparent;

Awire := AwireGroupHead.headwire;
  insertNewChild(Bwire,Awire);
  temp.testwire2 := Bwire;

BwireGroupHead.left .MIN AwireGroupHead.left;
  BwireGroupHead.right .MAX AwireGroupHead.right;
  BwireGroupHead.bottom .MIN AwireGroupHead.bottom;
  BwireGroupHead.top .MAX AwireGroupHead.top;

select := orderHdr.temp.select;    #search for select record to
  lastSelect := NULLPOINTER;         #AwireGroupHead WHILE select AND select.record <> AwireGroupHead DOB
  : lastSelect := select; select := select.next; END;
    IF select THENB "unselect it"
       IF lastSelect THEN lastSelect.next := select.next
          ELSE orderHdr.temp.select := select.next;
       disposeSelect(select);
       object.selectedItem:selectClass.selectCount .-1;
       END "unselect it";

remove(orderHdr,AwireGroupHead,NULLPOINTER,allMsg);

END "tie two wire groups together";
  END "insert single wire";

RETURN;

END "insert";
!###############################################################################
                                                                              #
 This procedure is used to delete a wire record from the system.              #
                                                                              #
!###############################################################################

BOOLEAN PROCEDURE removeSelectedWire(
  POINTER(wireClass) header;
  POINTER(wirePointClass) wire;
  PRODUCES REAL left,bottom,right,top;
  );

BEGIN "removeSelectedWire"
  BOOLEAN SaveMe;
  POINTER(wirePointClass) ptr1,ptr2;
  POINTER(wireClass) newHead;
  REAL lt,bm,rt,tp;
  POINTER(recordSelectClass) selrec;
```

```
left := right := wire.X;
bottom := top := wire.Y;

IF wire.status TST wireIsSelected THEN BEGIN "I am selected"
   SaveMe := FALSE;
   IF wire.wire AND wire.status NTST wirePointsToPins THENB "test others"
      ptr1 := wire.wire;

WHILE ptr1 DO BEGIN "search"
         ptr2 := ptr1.next;
         IF ptr1.status TST wireIsSelected THEN BEGIN "He is selected"

IF removeSelectedWire(header,ptr1,lt,bm,rt,tp) THEN
               BEGIN "save him"
               removeChild(header,ptr1);
               newHead := new(wireClass);
               newHead.left := lt;
               newHead.bottom := bm;
               newHead.right := rt;
               newHead.top := tp;
               newHead.headWire := ptr1;

newHead.addRev := object.temp:tempControlClass.revision;
               newHead.delRev := 0;
                                          #insert him into the list
               newHead.next := wireHdr.structure;
               wireHdr.structure := newHead;
               newHead.temp := new(tempWireSelectClass);

selRec := getSelect;       #select this new head
               selRec.record := newHead;
               selRec.status := dontBlockMsg;
               selRec.next := WireHdr.temp.select;
               wireHdr.temp.select := selRec;

object.selectedItem:selectClass.selectcount .+1;

END "save him"

ELSE BEGIN "delete him"
               removeChild(header,ptr1);
               Dispose(ptr1);
               END "delete him";
            END "He is selected"

ELSE BEGIN "He is Not"
            removeSelectedWire(header,ptr1,lt,bm,rt,tp);
            left .MIN lt;
            bottom .MIN bm;
            right .MAX rt;
            top .MAX tp;

SaveMe := TRUE;
            END "He is Not";

ptr1 := ptr2;
         END "search";
      END "test others";
   RETURN(SaveMe);
   END "I am selected"
ELSE BEGIN "cycle remove"
   IF wire.wire AND wire.status NTST wirePointsToPins THENB "test others"
      ptr1 := wire.wire;

WHILE ptr1 DO BEGIN "search"
         removeSelectedWire(header,ptr1,lt,bm,rt,tp);
         left .MIN lt;
         bottom .MIN bm;
         right .MAX rt;
         top .MAX tp;
         ptr1 := ptr1.next;
         END "search";
      END "test others";
   END "cycle remove";
```

```
RETURN(TRUE);
END "removeSelectedWire";

OLEAN PROCEDURE remove(
    POINTER(dataObjectClass) orderHdr;      #Pointer to the class header record
    POINTER(boundaryClass) record;          #Pointer to a wire record
    POINTER(boundaryClass) last;            #Pointer to the previous record
    USES INTEGER status;                    #Status indicator for search
);

BEGIN "remove"

POINTER(boundaryClass) temp;
POINTER(recordSelectClass) select;

ttywrite("REMOVE - " & index[status] & eol);

IF status <> selectMsg THEN BEGIN "disconnect it"

IF orderHdr.structure = record THEN
        orderHdr.structure := record.next  #Save the next record pointer EF last THEN last.next := record.next    #The new pointer after deletion ELSE BEGIN "search for last"
        temp := orderHdr.structure;
        last := NULLPOINTER;
        WHILE temp AND temp <> record DOB
            last := temp; temp := temp.next; END;

IF NOT last THEN RETURN(FALSE);
        last.next := record.next;
        END "search for last";

RETURN(TRUE);
    END "disconnect it"
EF status = selectMsg THEN BEGIN "delete selected items"
    wireHdr := orderHdr;

select := getSelect;
    select.status := 2 * object.temp:tempControlClass.deleteTransaction;
    select.record := duplicate(orderHdr,record,selectMsg);

IF select.record THENB "save and remove"
        select.next := orderHdr.temp.deleted;
        orderHdr.temp.deleted := select;
        RETURN(NOT removeSelectedWire(record,record:wireClass.headwire,
            record.left,record.bottom,record.right,record.top));
                                            #true indicates delete this header.
        END "save and remove"

ELSE BEGIN "nothing to delete"
        disposeSelect(select);
        END "nothing to delete";
    END "delete selected items";
RETURN(FALSE);

END "remove";

################################################################################
#
This procedure is used to restore the deleted wire record.                     #
#                                                                              #
################################################################################

OCEDURE restore(
    POINTER(dataObjectClass) orderHdr;      #Pointer to the class header record
    POINTER(boundaryClass) record;          #Pointer to the wire record
    INTEGER status;                         #The status indicator for search
);

BEGIN "restore"
#ttywrite("RESTORE - " & index[status] & eol);
```

```
RETURN;

END "restore";

################################################################
                                                               #
PROCEDURE that selects all records in an wire                  #
                                                               #
################################################################

.OCEDURE SelectAllWire(
POINTER(wirePointClass) wire;
);

BEGIN "selectAllWire"

IF wire.status NTST wireIsSelected THEN

BEGIN "select it"
   wire.status .IOR wireIsSelected;
   END "select it";

IF wire.wire AND wire.status NTST wirePointsToPins THENB "test others"
   wire := wire.wire;

WHILE wire DO BEGIN "search"
       SelectAllWire(wire);
      wire := wire.next;
      END "search";
   END "test others";

RETURN;
END "SelectAllWire";

OCEDURE select(
POINTER(dataObjectClass) orderHdr;
POINTER(boundaryClass) record;
INTEGER msg;
);
BEGIN "select"

IF orderHdr.temp.select THEN orderHdr.temp.select.status := dontBlockMsg;

#ttywrite("SELECT - " & index[msg] & eol);
IF msg <> allmsg THEN RETURN;

SelectAllWire(record:wireClass.headwire);

RETURN;
ND "select";

################################################################
                                                               #
PROCEDURE that unselects all records in an wire                #
                                                               #
################################################################

;OCEDURE unSelectAllWire(
POINTER(wirePointClass) wire;
);

BEGIN "unselectAllWire"

IF wire.status TST wireIsSelected THEN BEGIN "unHighLight"
   wire.status .CLR wireIsSelected;
   END "unHighLight";

IF wire.wire AND wire.status NTST wirePointsToPins THENB "test others"
   wire := wire.wire;

WHILE wire DO BEGIN "search"
       unSelectAllWire(wire);
      wire := wire.next;
```

```
      END "search";
    END "test others";

RETURN;
  END "unSelectAllWire";

OCEDURE unselect(
  POINTER(dataObjectClass) orderHdr;
  POINTER(boundaryClass) record;
  INTEGER msg;
  );
  BEGIN "unselect"

#ttywrite("UNSELECT - " & index[msg] & eol);
  IF msg <> allmsg THEN RETURN;

unSelectAllWire(record:wireClass.headwire);

RETURN;
  ND "unselect";

:##############################################################################
                                                                              #
  This procedure is used to search if the given point is part of the record.  #
                                                                              #
:##############################################################################

ROCEDURE selectWire(
  POINTER(wirePointClass) wire;
  );

BEGIN "selectWire";
  INTEGER mode;

IF wire.status NTST wireIsSelected THEN BEGIN "insert it"
     wirePointHighLight(wire);
     wire.status .IOR wireIsSelected;

RETURN;
     END "insert it";

mode := object:designObjectClass.temp:tempControlClass.mode;

IF mode <> movcase AND mode <> cpycase THEN BEGIN "delete it"

wirePointHighLight(wire);
     wire.status .CLR wireIsSelected;

RETURN;
     END "delete it";

RETURN;                               #No match is found, exit
  END "selectWire";

OOLEAN PROCEDURE pointSearch(
   POINTER(dataObjectClass) orderHdr;   #Pointer to the class header record
   POINTER(boundaryClass) record;       #Pointer to a wire record
   MODIFIES INTEGER status;             #Indicates the status of the search
   REAL SpointX, SpointY;               #The point to be searched
   );

BEGIN "pointSearch";
   POINTER(selectClass) select;
   POINTER(wirePointClass) temp;

#ttywrite("POINTSEARCH - " & index[status] & eol);
   IF NOT record THEN RETURN(FALSE);    #If no records, exit pointX := SpointX;
   pointY := SpointY;
   status := dontBlockMsg;

IF NOT SearchGroup(record) THENB
      record:wireClass.temp.selectParent := NULLPOINTER;
```

```
    record:wireClass.temp.selectChild := NULLPOINTER;
    RETURN(FALSE);
    END;

IF NOT foundParent THEN RETURN(FALSE);

select := object:designObjectClass.selectedItem;
select.action := noSelect;                  #indicate that we found something.

IF foundChild THENB "select line"
   IF foundChild.status TST wireIsSelected AND
      foundParent.status TST wireIsSelected THEN BEGIN "delete line"

record:wireClass.temp.selectParent := NULLPOINTER;
      record:wireClass.temp.selectChild := NULLPOINTER;

temp := foundChild.wire;
      WHILE temp AND
         (temp.status TST wirePointsToPins OR
          temp.status NTST wireIsSelected)
         DO temp := temp.next;
      IF NOT temp THEN selectwire(foundChild);

temp := foundParent.wire;
      WHILE temp AND
         (temp.status TST wirePointsToPins OR
          temp = foundChild OR
          temp.status NTST wireIsSelected)
         DO temp := temp.next;
      IF NOT temp AND
         ( NOT temp := findRealParent(foundParent) OR
           temp.status NTST wireIsSelected) THEN
         selectwire(foundParent);

END "delete line"
   ELSE BEGIN "other cases"
      record:wireClass.temp.selectParent := foundParent;
      record:wireClass.temp.selectChild := foundChild;

IF foundChild.status NTST wireIsSelected THEN
         selectWire(foundChild);
      IF foundParent.status NTST wireIsSelected THEN
         selectWire(foundParent);
      END "other cases";
   END "select line"

ELSE BEGIN "select point"

record:wireClass.temp.selectParent := foundParent;
   record:wireClass.temp.selectChild := NULLPOINTER;

selectWire(foundParent);
   END "select point";

RETURN(TRUE);
END "pointSearch";

##################################################################
                                                                 #
This procedure is used to search if the given area encloses the record.  #
                                                                 #
##################################################################

OCEDURE areaSearchWire(
POINTER(wirePointClass) wire;
);

BEGIN "areaSearchWire"

IF areaX1 <= wire.X <= areaX2 AND
   areaY1 <= wire.Y <= areaY2 AND
   wire.status NTST wireIsSelected THEN
```

```
   BEGIN "select it"
   wire.status .IOR wireIsSelected;
   foundFlag := TRUE;
   wirePointHighLight(wire);
   END "select it";

IF wire.wire AND wire.status NTST wirePointsToPins THENB "test others"
   wire := wire.wire;

WHILE wire DO BEGIN "search"
       AreaSearchWire(wire);
     wire := wire.next;
     END "search";
   END "test others";

RETURN;
END "AreaSearchWire";

BOOLEAN PROCEDURE areaSearch(
   POINTER(dataObjectClass) orderHdr;       #Pointer to the class header record
   POINTER(boundaryClass) record;           #Pointer to a wire record
   MODIFIES INTEGER status;                 #Indicates the status of the search
   REAL SareaX1, SareaY1, SareaX2, SareaY2; #The area to be searched
   );

BEGIN "areaSearch";

#ttywrite("AREASEARCH - " & index[status] & eol);
   IF NOT record THEN RETURN(FALSE);        #If no records, exit
   areaX1 := SareaX1;                       #set up search variables
   areaX2 := SareaX2;                       #these are global for speed.
   areaY1 := SareaY1;
   areaY2 := SareaY2;
   status := dontBlockMsg;

areaSearchWire(record:wireClass.headwire);

IF foundFlag THENB object:designObjectClass.selectedItem:selectClass.action := noSelect;
      record:wireClass.temp.selectParent := NULLPOINTER;
      record:wireClass.temp.selectChild := NULLPOINTER;
      END;

RETURN(foundFlag);

END "areaSearch";

###############################################################################
#
# This procedure is used for special searching of wire record in given area.  #
#                                                                             #
###############################################################################

BOOLEAN PROCEDURE specialSearch(
   POINTER(dataObjectClass) orderHdr;       #Pointer to the class header record
   POINTER(boundaryClass) record;           #Pointer to a wire record
   MODIFIES INTEGER status;                 #Indicates the status of the search
   REAL areaX1, areaY1, areaX2, areaY2;     #The area to be searched
   );

BEGIN "specialSearch"

RETURN(FALSE);

END "specialSearch";
```

```
###########################################################################
#                                                                         #
# This procedure is used by the menu system.                              #
#                                                                         #
#####################################################################

PROCEDURE methodProcedure(
      POINTER(objectClass) object;        #Pointer to the object record
      OPTIONAL STRING selector;           #The selector contains menu entry
      );

BEGIN "methodProcedure"

RETURN;

END "methodProcedure";

END "wirOpr";

###########################################################################
#                                                                         #
  This routine is for updating a record with the field information.       #
                                                                          #
#####################################################################

OLEAN PROCEDURE update(
   POINTER(dataObjectClass) compHdr;     #Pointer to the comp header record
   POINTER(boundaryClass) cmp;           #Pointer to the component record
   USES INTEGER Msg;                     #Record Msg indicator
   USES STRING fieldName;                #Menu selector item
   USES STRING newValue;                 #Contains new value of rule, etc.
   );

BEGIN "update"
POINTER(dataObjectClass) newComp;

IF equ(fieldName,"COMPONENTSELECT",uppercase) THEN BEGIN "switch component"
   IF msg = special1Msg THEN RETURN(TRUE);

component.task.cleanup(cmp,allMsg);  #cleanup and delete old structure
   $structureDispose(component.structure);

newComp := generate(compHdr,allMsg,0.,0.,cmp.left,cmp.bottom,0.,0.);
   cmp.left := newComp.left;            #generate new structure
   cmp.bottom := newComp.bottom;
   cmp.right := newComp.right;
   cmp.top := newComp.top;
   component.structure := newComp.structure; #transfer the data Dispose(newComp);
   RETURN(TRUE);
   END "switch component";

RETURN(FALSE);

END "update";

###########################################################################
#                                                                         #
PROCEDURE for moving a records.                                           #
                                                                          #
#####################################################################

ROCEDURE move(
POINTER(dataObjectClass) compHdr;       #Pointer to the comp header record
POINTER(boundaryClass) cmp;             #Pointer to the component record
USES INTEGER Msg;                       #Record Msg indicator
REAL deltaX, deltaY;
);

BEGIN "move"
POINTER(dataObjectClass) order;         #Pointer to the class under the component
```

```
cmp.left .+ deltaX;
cmp.bottom .+ deltaY;
cmp.right .+ deltaX;
cmp.top .+ deltaY;

order := component.structure;           #Get pointer to the class under component.
WHILE order DO
   BEGIN "loop through orders"          #Cycle through all class records component.task.move(cmp,order,allMsg,deltaX,deltaY); #Move all class objects
   order := order.next;                 #Get pointer to the next class record END "loop through orders";

RETURN;

END "move";

############################################################################
                                                                           #
   This routine is for copying a record.                                   #
                                                                           #
############################################################################

POINTER (boundaryClass) PROCEDURE duplicate(
POINTER(dataObjectClass) compHdr;       #Pointer to the comp header record
POINTER(boundaryClass) cmp;             #Pointer to the component record
USES INTEGER Msg;                       #Record Msg indicator
);

BEGIN "duplicate"

POINTER(dataObjectClass) cpm;
POINTER(boundaryClass) ptr1,ptr2;

cpm := new(dataObjectClass);

cpm.left := cmp.left;
cpm.bottom := cmp.bottom;
cpm.right := cmp.right;
cpm.top := cmp.top;

cpm.type := component.type;
cpm.structure := NULLPOINTER;
cpm.temp := NULLPOINTER;
IF msg = componentMsg THEN RETURN(cpm);

ptr1 := component.structure;

WHILE ptr1 DOB "each item"

ptr2 := component.task.duplicate(cmp,ptr1,allmsg);
   IF ptr2 THEN BEGIN "insert"
      ptr2.next := cpm.structure;       #insert on cpm header
      cpm.structure := ptr2;
      END "insert";

ptr1 := ptr1.next;
   END "each item";

IF cpm.structure THEN RETURN(cpm) ELSE RETURN(NULLPOINTER);

END "duplicate";

############################################################################
                                                                           #
   This routine is for adding a record to the system.                      #
                                                                           #
############################################################################

PROCEDURE insert(
POINTER(dataObjectClass) compHdr;       #Pointer to the comp header record
POINTER(boundaryClass) cmp;             #Pointer to the component record
INTEGER Msg;                            #Indiactes record Msg indicator
);
```

```
BEGIN "insert"

IF NOT cmp THEN RETURN;                    #If not component record return
    cmp.next := compHdr.structure;             #Put component record into structure by
    compHdr.structure := cmp;                  # adjusting pointers
    getDataOperator(cmp);

RETURN;
END "insert";

################################################################################
#
#   This procedure deletes the selected records.                               #
#                                                                              #
################################################################################

BOLEAN
PROCEDURE remove(
    POINTER(dataObjectClass) compHdr;          #Pointer to the comp header class
    POINTER(boundaryClass) cmp;                #Pointer to the component under the comp
    POINTER(boundaryClass) last;               #Pointer to the last component record
    USES INTEGER Msg;                          #Record Msg indicator
);

BEGIN "remove"

POINTER(boundaryClass) rec;

IF msg = selectMsg OR msg = allMsg THEN RETURN(TRUE); #This is a test
                                        #for removal of this item.

IF compHdr.structure = cmp THEN compHdr.structure := component.next
        EF last THEN last.next := component.next
            ELSE BEGIN "find last"
                rec := compHdr.structure;
                last := NULLPOINTER;
                WHILE rec AND rec <> cmp DOB
                    last := rec; rec := rec.next; END;
                IF rec THEN last.next := component.next;

END "find last";

RETURN(TRUE);

END "remove";

################################################################################
#
#   This procedure restores the deleted records.                               #
#                                                                              #
################################################################################

PROCEDURE restore(
    POINTER(dataObjectClass) compHdr;          #Pointer to the comp header class
    POINTER(boundaryClass) cmp;                #Pointer to the component under the comp
    INTEGER Msg;                               #The Msg of record indicator
);

BEGIN "restore"

RETURN;

END "restore";

################################################################################
#
#   component select routine calls all of the selects if the message is "ALL"  #
#   or calls only the desired selected class according to the message in       #
#   "selectString".                                                            #
#                                                                              #
################################################################################

PROCEDURE select(
    POINTER(dataObjectClass) compHdr;          #Pointer to the comp header class
```

```
POINTER(boundaryClass) cmp;              #Pointer to the component under the comp
INTEGER Msg;                             #The Msg of record indicator
);

BEGIN "select"

RETURN;

END "select";

###############################################################
                                                              #
  component unselect routine calls all of the unselect if the message is "ALL" #
  or calls only the desired unselect class according to the message in         #
  "selectString"                                              #
                                                              #
###############################################################

:OCEDURE unselect(
POINTER(dataObjectClass) compHdr;        #Pointer to the comp header class
POINTER(boundaryClass) cmp;              #Pointer to the component under the comp
INTEGER Msg;                             #The Msg of record indicator
);

BEGIN "unselect"

RETURN;

END "unselect";

###############################################################
                                                              #
  This routine is for point search.                           #
                                                              #
###############################################################

)LEAN PROCEDURE pointSearch(
POINTER(dataObjectClass) compHdr;        #Pointer to the comp header class
POINTER(boundaryClass) cmp;              #Pointer to the component under the comp
MODIFIES INTEGER msg;                    #Indicates status of search
REAL pointX, pointY;                     #The point to be searched
);

BEGIN "pointSearch";

RETURN(TRUE);

END "pointSearch";

###############################################################
                                                              #
  This routine is for special area search testing             #
                                                              #
###############################################################

)OLEAN PROCEDURE areaSearch(
POINTER(dataObjectClass) compHdr;        #Pointer to the comp header class
POINTER(boundaryClass) cmp;              #Pointer to the component under the comp
MODIFIES INTEGER msg;                    #Indicates status of search
REAL areaX1, areaY1, areaX2, areaY2;     #The area to be searched
);

BEGIN "areaSearch";

RETURN(TRUE);
END "areaSearch";

###############################################################
                                                              #
  This routine is for special area search testing             #
                                                              #
###############################################################

)OLEAN PROCEDURE specialSearch(
```

```
POINTER(dataObjectClass) compHdr;        #Pointer to the comp header class
POINTER(boundaryClass) cmp;              #Pointer to the component under the comp
MODIFIES INTEGER msg;                    #Indicates status of search
REAL areaX1, areaY1, areaX2, areaY2;     #The area to be searched
);

BEGIN "specialSearch";

RETURN(TRUE);
END "specialSearch";

#################################################################
#                                                               #
# This procedure finds the bounding box for the given symbol.   #
#                                                               #
#################################################################

PROCEDURE findMinMax(
   MODIFIES REAL left, bottom, right, top;    #Boundary box limits
   POINTER(dataObjectClass) dataObject;  #Pointer to the head data object
   );

BEGIN "findMinMax"

POINTER(boundaryClass) rec;           #Pointer to the data object record

IF NOT dataObject THEN RETURN;        #If there are no records, return

IF dataObject.type <= orderMsg THEN
      findMinMax(left,bottom,right,top,dataObject.structure)
                                         #Find boundary of underneath records
   ELSE BEGIN "get actual"               #Compute actual boundary limits rec := dataObject.structure;       #Get record underneath the structure
      WHILE rec DO
         BEGIN "process all records"     #Process all records left .MIN (rec.left MIN rec.right);    #Find left boundary
         bottom .MIN (rec.bottom MIN rec.top);  #Find bottom boundary
         right .MAX (rec.left MAX rec.right);   #Find right boundary
         top .MAX (rec.bottom MAX rec.top);     #Find top boundary rec := rec.next;                #Get next record END "process all records"

END "get actual";

findMinMax(left,bottom,right,top,dataObject.next);
                                         #Find boundary box for next record
   RETURN;

END "findMinMax";

#################################################################
#                                                               #
#  This procedure displays all the records contained in a group #
#                                                               #
#################################################

PROCEDURE display(
   POINTER(dataObjectClass) pageHdr;     #Pointer to the page header class
   POINTER(boundaryClass) grp;           #Pointer to the selected group
   INTEGER Msg;
   );

BEGIN "display"

POINTER(dataObjectClass) order;       #Pointer to the class under the group

IF NOT (msg = allMsg OR msg = selectMsg) THEN RETURN;

order := group.structure;             #Get a pointer to class under group
```

APPENDIX II
MEDIUM LEVEL PROGRAMMING

```
WHILE order DO
   BEGIN "loop through classes"              #Cycle through all classes group.task.display(grp,order,Msg);     #Display all classes
      order := order.next;                   #Get pointer to the next class END "loop through classes";

RETURN;
END "display";

############################################################################
#
# PROCEDURE for moving a records.                                          #
#                                                                          #
############################################################################

PROCEDURE move(
   POINTER(dataObjectClass) pageHdr;         #Pointer to the page header record
   POINTER(boundaryClass) grp;               #Pointer to the group record
   USES INTEGER Msg;                         #Record Msg indicator
   REAL deltaX, deltaY;
   );

BEGIN "move"
      POINTER(dataObjectClass) order;        #Pointer to the class under the group

#Get pointer to the class under group
      order := group.structure;
      WHILE order DO                         #Cycle through all class records
         BEGIN "loop through orders"

group.task.move(grp,order,Msg,deltaX,deltaY); #Move all class objects
            order := order.next;             #Get pointer to the next class record END "loop through orders";

RETURN;

END "move";

############################################################################
#
#   This routine is for copying a record.                                  #
#                                                                          #
############################################################################

POINTER (boundaryClass) PROCEDURE duplicate(
   POINTER(dataObjectClass) pageHdr;         #Pointer to the page header record
   POINTER(boundaryClass) grp;               #Pointer to the group record
   USES INTEGER Msg;                         #Record Msg indicator
   );

BEGIN "duplicate"

POINTER(dataObjectClass) gpr;
      POINTER(boundaryClass) ptr1,ptr2;

gpr := new(dataObjectClass);

gpr.left   := grp.left;
      gpr.bottom := grp.bottom;
      gpr.right  := grp.right;
      gpr.top    := grp.top;

gpr.type := group.type;
      gpr.structure := NULLPOINTER;
      gpr.temp := NULLPOINTER;
      IF msg = groupMsg THEN RETURN(gpr);

ptr1 := group.structure;

WHILE ptr1 DOB "each item"
```

```
   ptr2 := group.task.duplicate(grp,ptr1,msg);
   IF ptr2 THEN BEGIN "insert"
      ptr2.next := gpr.structure;        #insert on gpr header
      gpr.structure := ptr2;
      END "insert";

ptr1 := ptr1.next;
   END "each item";

IF gpr.structure THEN RETURN(gpr) ELSE RETURN(NULLPOINTER);

END "duplicate";

###########################################
#                                                    APPENDIX III
#   This is the genernic move program         HIGH LEVEL PROGRAMMING

###############################################################################

BEGIN "dobmov"

RESTOREFROM "(application header)";      #Reference all necessary stuff.
SOURCEFILE "/coleby/logical/operatorClass.ms";

MODULE(methodClass) dobmov;

INITIAL PROCEDURE setup;
   BEGIN "setup"
   ttywrite(" DOBMOV: V2.0 Dec 23, 1983 ",eol);
   RETURN;
   END "setup";

PROCEDURE methodProcedure(
      POINTER(objectClass) self;
      OPTIONAL STRING selector;
      );

BEGIN "methodProcedure"

POINTER(dataobjectClass) dataobj;
   REAL deltaX,deltaY,x2,y2,x3,y3;
   INTEGER dragmsg;

object := self;
   dataobj := object.structure;

IF NOT dataObj.structure THEN RETURN;

deltaX := object.selectedItem:selectClass.x1;
   deltaY := object.selectedItem:selectClass.y1;
   x2 := y2 := x3 := y3 := 0.;

IF object.selectedItem:selectClass.action TST pointSelect THENB "drag"
         dragMsg := selectMsg;
         dataObj.task.drag(dataObj,deltaX,deltaY,x2,y2,x3,y3,dragMsg,
            dataObj.structure);
         object.selectedItem:selectClass.x1 := deltaX := x2-deltaX;
         object.selectedItem:selectClass.y1 := deltaY := y2-deltaY;
         END "drag";

dataObj.task.unselect(dataObj,dataObj.structure,unHighLightMsg);
      dataObj.task.erase(dataObj,dataObj.structure,selectMsg);
      dataobj.task.move(dataobj,dataObj.structure,selectMsg,deltaX,deltaY);
      dataObj.task.display(dataObj,dataObj.structure,selectMsg);
      dataObj.task.unselect(dataObj,dataObj.structure,selectMsg);

object.selectedItem:selectClass.havebox := FALSE;

RETURN;
   END "methodProcedure";

END "dobmov"
```

```
###########################################################

#   This is the genernic copy program

###########################################################

BEGIN "dobcpy"

RESTOREFROM "(application header)";      #Reference all necessary stuff.
SOURCEFILE "/coleby/logical/operatorClass.ms";

MODULE(methodClass) dobcpy;

INITIAL PROCEDURE setup;
  BEGIN "setup"
  ttywrite(" DOBCPY: V2.0 Dec 23, 1983 ",eol);
  RETURN;
  END "setup";

PROCEDURE methodProcedure(
    POINTER(objectClass) self;
    OPTIONAL STRING selector;
    );

BEGIN "methodProcedure"

POINTER(dataobjectClass) dataobj;
  REAL deltaX,deltaY,x2,y2,x3,y3;
  INTEGER dragMsg;

object := self;
  dataobj := object.structure;

IF NOT dataObj.structure THEN RETURN;

deltaX := object.selectedItem:selectClass.x1;
  deltaY := object.selectedItem:selectClass.y1;
  x2 := y2 := x3 := y3 := 0.;

IF object.selectedItem:selectClass.action TST pointSelect THENB "drag"
    dragMsg := selectMsg;
    dataObj.task.drag(dataObj,deltaX,deltaY,x2,y2,x3,y3,dragMsg,
      dataObj.structure);
    object.selectedItem:selectClass.x1 := deltaX := x2-deltaX;
    object.selectedItem:selectClass.y1 := deltaY := y2-deltaY;
    END "drag";

dataObj.task.unselect(dataObj,dataObj.structure,unHighLightMsg);
  dataObj.task.duplicate(dataObj,dataObj.structure,selectMsg);
  dataobj.task.move(dataobj,dataObj.structure,selectMsg,deltaX,deltaY);
  dataObj.task.display(dataObj,dataObj.structure,selectMsg);
  dataObj.task.unselect(dataObj,dataObj.structure,selectMsg);

object.selectedItem:selectClass.havebox := FALSE;

RETURN;
  END "methodProcedure";

END "dobcpy"

###########################################################

#   This is the generdic delete program

###########################################################

BEGIN "dobdel"

RESTOREFROM "(application header)";      #Reference all necessary stuff.
SOURCEFILE "/coleby/logical/operatorClass.ms";

MODULE(methodClass) dobdel;
```

```
INITIAL PROCEDURE setup;
  BEGIN "setup"
  ttywrite(" DOBDEL: V2.0 Dec 23, 1983 ",eol);
  RETURN;
  END "setup";

PROCEDURE methodProcedure(
    POINTER(objectClass) self;
    OPTIONAL STRING selector;
    );

BEGIN "methodProcedure"

POINTER(dataobjectClass) dataobj;

object := self;
  dataobj := object.structure;
  IF NOT dataObj.structure THEN   RETURN;

dataobj.task.unselect(dataObj,dataObj.structure,unHighLightMsg);
  dataobj.task.erase(dataObj,dataObj.structure,selectMsg);
  dataobj.task.remove(dataobj,dataObj.structure,NULLPOINTER,selectMsg);
  dataobj.task.unselect(dataObj,dataObj.structure,selectMsg);

object.selectedItem:selectClass.havebox := FALSE;

RETURN;
  END "methodProcedure";

END "dobdel"
    menulabel=slaveinit
    selector=dataObj
    modulename=dobint
    menulabel=display
    modulename=dobdis
    menulabel=init
    selector=DATAOBJ,GRID,logicPage
    modulename=dobint
    sourcefile "(control.cfg)"
    menulabel=open
    selector=selected
    modulename=dobact
    menulabel=bulkinstance.
    modulename=hierma
    selector=BULK INSTANTIATE
    menulabel=activate
    modulename=dobact
    menulabel=text
    modulename=txtopr
    selector=addtofile
    menulabel=dataobj
    menutype='20
    modulename=dobopr
    >
    menulabel=part
    modulename=prtopr
    menulabel=node
    modulename=nodopr
    menulabel=group
    modulename=grpopr
    >
    menulabel=order
    modulename=ordopr
    >
    menulabel=page
    modulename=pagopr
    <
    menulabel=logicPage
    modulename=ordopr
    >
    menulabel=component
    modulename=cmpopr
    >
```

APPENDIX IV
CONFIGURATION FILE

```
menulabel=secorder
modulename=ordopr
>
menulabel=prim
modulename=prmopr
menulabel=pin
modulename=pinopr
menulabel=line
modulename=linopr
menulabel=arc
modulename=arcopr
menulabel=text
modulename=txtopr
menulabel=triangle
modulename=triopr
<
<
menulabel=connector
modulename=pinopr
menulabel=wire
modulename=wiropr
menulabel=prim
modulename=prmopr
menulabel=line
modulename=linopr
menulabel=box
modulename=boxopr
menulabel=arc
modulename=arcopr
menulabel=circle
modulename=ciropr
menulabel=text
<
<
<
!
menulabel=DELETE
menutext=DELETE
selector=DELETE
modulename=dobctl
*width=110
*height=23
>
menulabel=restore
menutext=RESTORE
selector=ALL
modulename=dobudl
*width=80
*height=23
<
menulabel=COPY
menutext=COPY
selector=COPY
modulename=dobctl
*height=23
>
menulabel=COPYTOFILE
menutext=TEXT TO FILE
selector=copytofile
modulename=txtopr
*width=110
*height=23
1/menulabel=copy
menutext=TO CLIPBOARD
selector=COPY/CUT
modulename=dobctl
*height=23
<
menulabel=MOVE
menutext=MOVE
selector=MOVE
modulename=dobctl
*height=23
>
```

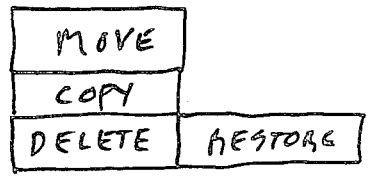

```
menulabel=CUT
menutext=TO CLIPBOARD
selector=CUT
modulename=dobctl
*width=110
*height=23
<
menulabel=insert
menutext=INSERT
selector=
modulename=
*height=23
>
menulabel=LINES
menutext=LINES
selector=LINE
modulename=dobins
*width=125
*height=23
>
1/menulabel=STRAIGHT
menutext=STRAIGHT
selector=LINE
modulename=dobins
*width=100
*height=23
menulabel=RECTANGLE
menutext=RECTANGLE
selector=BOX
modulename=dobins
*height=23
menulabel=ARC
menutext=ARCS
selector=ARC
modulename=dobins
*height=23
menulabel=CIRCLE
menutext=CIRCLE
selector=CIRCLE
modulename=dobins
*height=23
<
menulabel=Ground
menutext=GROUNDS
selector=CONNECTOR
modulename=dobins
*height=23
>
menulabel=ANALOG
menutext=ANALOG
selector=Connector:ANALOG
modulename=pinopr
*width=80
*height=23
1/menulabel=GROUND
menutext=DIGITAL
selector=Connector:GROUND
modulename=pinopr
*height=23
menulabel=CHASSIS
menutext=CHASSIS
selector=Connector:CHASSIS
modulename=pinopr
*height=23
<
menulabel=CONNECTOR
menutext=CONNECTOR
selector=CONNECTOR
modulename=dobins
*height=23
>
menulabel=FEMALE2
menutext=SP FEMALE
```

```
selector=Connector:FEMALE2
modulename=pinopr
*width=100
*height=23
>CNTROT
menulabel=FEMALE
menutext=FEMALE
selector=Connector:FEMALE
modulename=pinopr
*height=23
>CNTROT
1/menulabel=SHEET
menutext=SHEET
selector=Connector:NEGATION
modulename=pinopr
*height=23
>CNTROT
menulabel=MALE
menutext=MALE
selector=Connector:MALE
modulename=pinopr
*height=23
>CNTROT
menulabel=MALE2
menutext=SP MALE
selector=Connector:MALE2
modulename=pinopr
*height=23
>CNTROT
<
1/menulabel=wire
menutext=WIRES
selector=WIRE
modulename=dobins
*height=23
menulabel=Component
menutext=COMPONENT
selector=COMPONENT
modulename=dobins
*height=23
>
menulabel=get component
menuText=BY NAME
selector=GET COMPONENT
modulename=cmpopr
*width=120
*height=23
1/menulabel=ROT
menutext=ROTATION
selector=
modulename=
*height=23
>COMPROT
<
menulabel=Primitives
menutext=SHAPES
selector=prim
modulename=dobins
*height=23
>
menulabel=SOR
menutext=WIRED OR
selector=SOR
modulename=prmopr
*width=110
*height=23
>SHPROT
menulabel=SAND
menutext=WIRED AND
selector=SAND
```

What is claimed is:

1. A computer-performed method of designing a system comprising:
   inputting to said computer a plurality of stored data records, each representing a primitive element in said system and a plurality of manipulative programs linked to each data record, said manipulative programs performing the necessary operations on said primitive elements for the design of said system;
   linking said data records in a hierarchy of primitive elements which represent said system; and
   inputting to said computer a series of high order commands which operate selected manipulative programs in said hierarchy.

2. The method recited in claim 1 wherein said manipulative programs perform the operations of writing and reading the associated data record to file.

3. The method recited in claim 1 wherein said manipulative programs perform the graphic operations of displaying and erasing the primitive element from a graphical display.

4. The method recited in claim 1 wherein said manipulative programs perform said operations in real time allowing for user interaction.

5. The method recited in claim 1 wherein said hierarchy is a data base which includes data objects each having said data records and the linked manipulative programs, whereby major changes to the data base are made with a minimum of program changes.

6. The method recited in claim 1 further comprising:
   inputting to said computer a menu/configuration file which allows new applications to be configured into the system via said configuration file.

7. The method recited in claim 1 wherein said system is an electrical circuit further comprising:
   inputting to said computer a high order command which generates a logical model representing the operation of said circuit;
   generating an electrical circuit layout from said logical model;
   generating a mechanical design from said electrical circuit layout;
   producing documentation from said logical model, said circuit layout and said mechanical design; and
   wherein said logical model, said electrical circuit layout and said mechanical design are all produced from the same data records linked in a hierarchy of primitive elements in said computer so that changes in any one of said model or layouts are reflected in changes in all of them and in their documentation.

8. A computer graphics program for designing a system comprising:
   a plurality of data objects, each having data records representing primitive elements in said system and a plurality of manipulative programs linked to each data record, said manipulative programs performing the necessary operations on said primitive elements for the design of said system.

9. The computer graphics program recited in claim 8 wherein said data records are linked in a hierarchy of primitive elements which represent said system.

10. The computer graphics program recited in claim 9 wherein said data objects are linked in a hierarchy which includes medium level data objects having other data objects linked thereto.

11. The computer graphics program recited in claim 10 further comprising:
    high order commands which provide access to the hierarchy of data objects.

12. The computer graphics program recited in claim 11 further comprising:
    a menu/configuration file for inputting new applications.

* * * * *